(12) United States Patent
Dai et al.

(10) Patent No.: US 8,476,658 B2
(45) Date of Patent: Jul. 2, 2013

(54) SEMICONDUCTOR LIGHT-EMITTING DEVICES

(76) Inventors: Jing Jie Dai, Taichung (TW); Yen Chieh Huang, Taichung (TW); Shu Ying Yang, Taichung (TW)

( * ) Notice: Subject to any disclaimer, the term of this patent is extended or adjusted under 35 U.S.C. 154(b) by 482 days.

(21) Appl. No.: 12/652,977

(22) Filed: Jan. 6, 2010

(65) Prior Publication Data

US 2011/0121348 A1 May 26, 2011

Related U.S. Application Data

(60) Provisional application No. 61/232,553, filed on Nov. 25, 2009.

(51) Int. Cl.
*H01L 33/00* (2010.01)
(52) U.S. Cl.
USPC .................................. 257/98; 257/E33.068
(58) Field of Classification Search
USPC .. 257/79, 98, 99, E33.001, E33.067–E33.069
See application file for complete search history.

(56) References Cited

U.S. PATENT DOCUMENTS

| 2008/0303042 | A1* | 12/2008 | Minato et al. ................. 257/98 |
| 2010/0102353 | A1 | 4/2010 | Park | |

FOREIGN PATENT DOCUMENTS

| JP | 8-116088 | 5/1996 |
| JP | 2002-280611 | 9/2002 |
| JP | 2008-131000 | 6/2008 |
| JP | 2008-177528 | 7/2008 |
| KR | 10-2006-0079196 | 7/2006 |
| KR | 10-2009-0002313 | 1/2009 |
| KR | 10-2009-0020215 | 2/2009 |
| KR | 10-2009-0054421 | 5/2009 |
| KR | 10-2010-0042041 | 4/2010 |
| TW | 536841 | 6/2003 |
| TW | 561632 | 11/2003 |
| WO | 2006/096767 | 9/2006 |

OTHER PUBLICATIONS

Office Action of Japan Counterpart application No. 2010-150906, issued May 15, 2012 cites JP 2002-280611, 2008-131000, 8-116088, WO 2006/096767, and US 2010/0102353.
English translation of the Office Action for JP counterpart application No. 2010-150906, issued May 15, 2012.
English Abstract of JP 2002-280611, 2008-131000, 8-116088, WO 2006/096767, and US 2010/0102353.
Office Action from corresponding KIPO application No. 10-2010-0076865 filed Aug. 25, 2011 cites KR 10-2009-0020215, KR 10-2009-0002313, KR 10-2009-0054421, KR 10-2006-0079196, JP 2008-177528, KR 10-2010-0042041.
English Translation of Office Action from corresponding KIPO application No. 10-2010-0076865 filed Aug. 25, 2011.
English Translations of KR 10-2009-0020215, KR 10-2009-0002313, KR 10-2009-0054421, KR 10-2006-0079196, JP 2008-177528, KR 10-2010-0042041, cited in Office Action from corresponding KIPO application No. 10-2010-0076865 filed Aug. 25, 2011.

* cited by examiner

Primary Examiner — Matthew Landau
Assistant Examiner — Candice Y Chan
(74) Attorney, Agent, or Firm — Patterson & Sheridan, LLP

(57) ABSTRACT

A semiconductor light-emitting device includes a substrate having an upper surface and a plurality of bumps positioned over the upper surface in a periodic manner, a first conductive type semiconductor layer positioned over the substrate, a light-emitting structure positioned over the first conductive type semiconductor layer, and a second conductive type semiconductor layer positioned over the light-emitting structure. The first conductive type semiconductor layer includes a plurality of protrusions each facing a portion of the substrate between the bumps, the protrusions are positioned in a ring manner at a peripheral region of the first conductive type semiconductor layer, and the protrusions are spaced apart from the bumps.

19 Claims, 24 Drawing Sheets

SEMICONDUCTOR LIGHT-EMITTING DEVICES

BACKGROUND OF THE INVENTION (A) Field of the Invention

The present disclosure relates to a semiconductor light-emitting device, and more particularly, to a semiconductor light-emitting device with improved light-extraction efficiency.

(B) Description of the Related Art

Semiconductor light-emitting devices such as light-emitting diodes (LED) are widely used in traffic lights, vehicle electronics, LCD backing lights, and general illumination. In the light-emitting diode an n-type semiconductor layer, a light-emitting region and a p-type semiconductor layer are essentially made to grow over a substrate to form a layered structure, and the electrodes are formed over the p-type semiconductor layer and over the n-type semiconductor layer. Light is generated through the recombination of holes and electrons that have been injected through the semiconductor layers to the light-emitting region, and then emitted through a light transmitting electrode over the p-type semiconductor layer or from the substrate. The material used for preparing the visible light-emitting diode includes the III-V compound such as AlGaInP for green, yellow, orange or red light-emitting diodes, and GaN for blue or ultraviolet light-emitting diodes, wherein the GaN light-emitting diode is formed over the sapphire substrate.

Extracting the light beams generated by the light-emitting layer to the outside of the light-emitting device is one important aspect to be improved in the semiconductor light-emitting device. Researchers use a transparent electrode in the conventional light-emitting device to prevent the upward light beams generated by the light-emitting layer from being blocked over the propagation path to the outside of the light-emitting device, or use a reflection layer to reflect the downward light beams generated by the light-emitting layer back to the top of the light-emitting device. However, in addition to the upward light beams and downward light beams, the light-emitting layer also emits light beams in other directions, and a portion of the light beams are reflected internally into the light-emitting device due to the total reflection effect. Consequently, the light beams may be adsorbed by the light-emitting layer, rather than propagating to the outside of the light-emitting device.

TW 561632 discloses a semiconductor light-emitting device having at least one recess and/or protruding portion over the surface portion of a substrate. The recess and/or protruding portion has a shape that prevents crystal defects from occurring in semiconductor layers. In addition, TW 536841 discloses a semiconductor light-emitting element having an undulation formed over the surface of a first layer (substrate), and a second layer having a refractory index different from that of the first layer grown to fill the undulation. Furthermore, a first crystal may be grown in an undulated shape over a crystal layer, which is the foundation of crystal growth. After such undulated refractory interface is formed, a semiconductor crystal layer having a refractory index different from that of the first layer is laminated thereon.

SUMMARY OF THE INVENTION

One aspect of the present disclosure provides a semiconductor light-emitting device with improved light-extraction efficiency by forming bumps over a substrate and a first conductive type semiconductor layer having a plurality of protrusions each spaced apart from the bumps and facing a portion of the substrate between the bumps and positioned in a ring manner at a peripheral region of the first conductive type semiconductor layer.

A semiconductor light-emitting device according to this aspect of the present disclosure comprises a substrate including an upper surface and a plurality of bumps positioned over the upper surface in a periodic manner, a first conductive type semiconductor layer positioned over the substrate, a light-emitting structure positioned over the first conductive type semiconductor layer, and a second conductive type semiconductor layer positioned over the light-emitting structure. The first conductive type semiconductor layer includes a plurality of protrusions each facing a portion of the substrate between the bumps, the protrusions are positioned in a ring manner at a peripheral region of the first conductive type semiconductor layer, and the protrusions are spaced apart from the bumps.

The foregoing has outlined rather broadly the features and technical advantages of the present disclosure in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the invention as set forth in the appended claims.

BRIEF DESCRIPTION OF THE DRAWINGS

The objectives and advantages of the present disclosure will become apparent upon reading the following description and upon reference to the accompanying drawings in which.

DETAILED DESCRIPTION OF THE INVENTION

Figure 1:
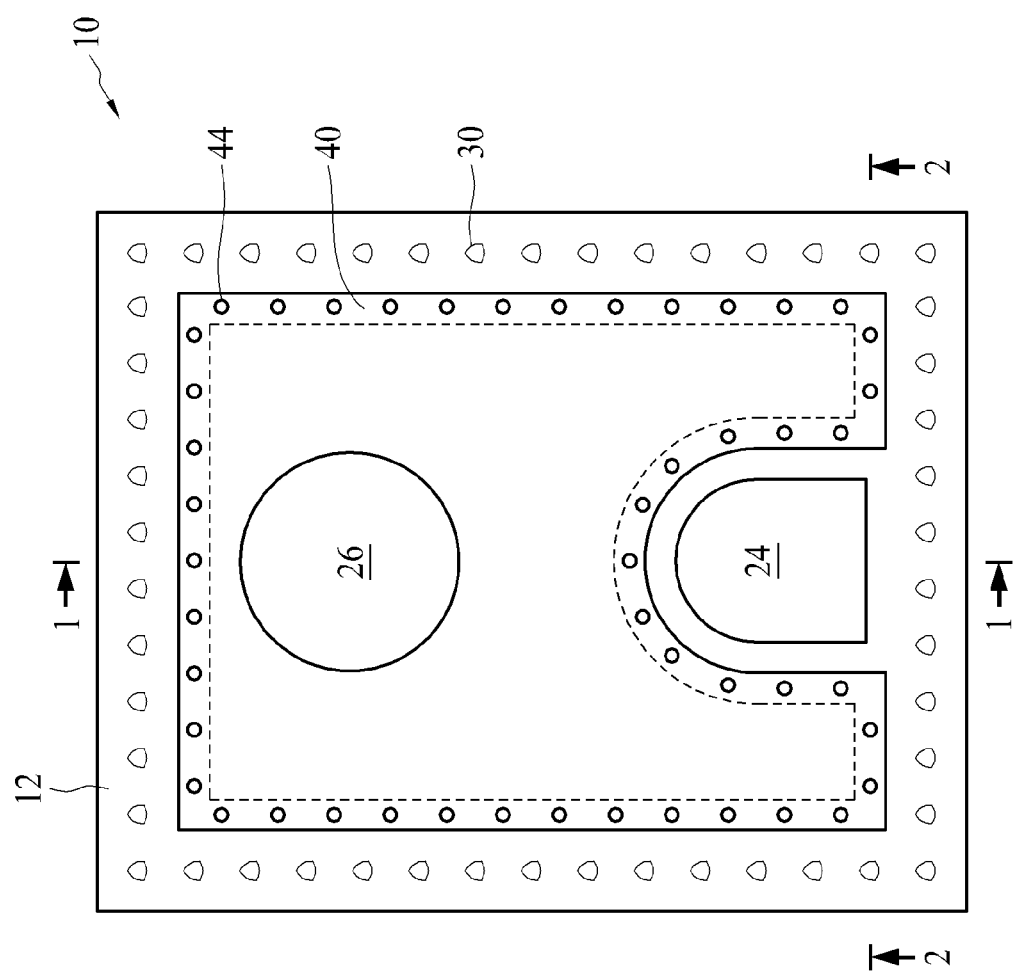
FIG. 1 is a top view of a semiconductor light-emitting device according to a first embodiment of the present disclosure.
Figure 2:
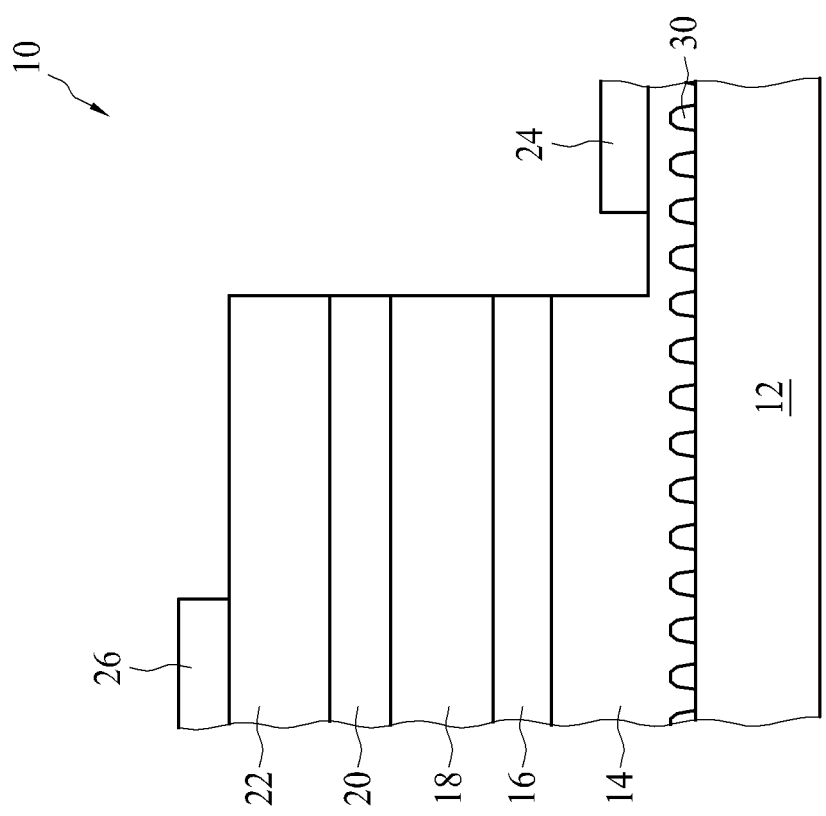
FIG. 2 is a cross-sectional view along the line 1-1 in FIG. 1.

FIG. 1 is a top view of a semiconductor light-emitting device 10 according to a first embodiment of the present disclosure, and FIG. 2 is a cross-sectional view along the cross-sectional line 1-1 in FIG. 1. The semiconductor light-emitting device 10 comprises a substrate 12 having a plurality of bumps 30, an n-type semiconductor layer 14 positioned over the substrate 12, a light-emitting structure 16 positioned over the n-type semiconductor layer 14, a p-type semiconductor layer 18 positioned over the light-emitting structure 16, a contact layer 20 positioned over the p-type semiconductor layer 18, a transparent conductive layer 22 positioned over the contact layer 20, a first electrode 24 positioned over the n-type semiconductor layer 14, and a second electrode 26 positioned over the transparent conductive layer 22.

Figure 3:
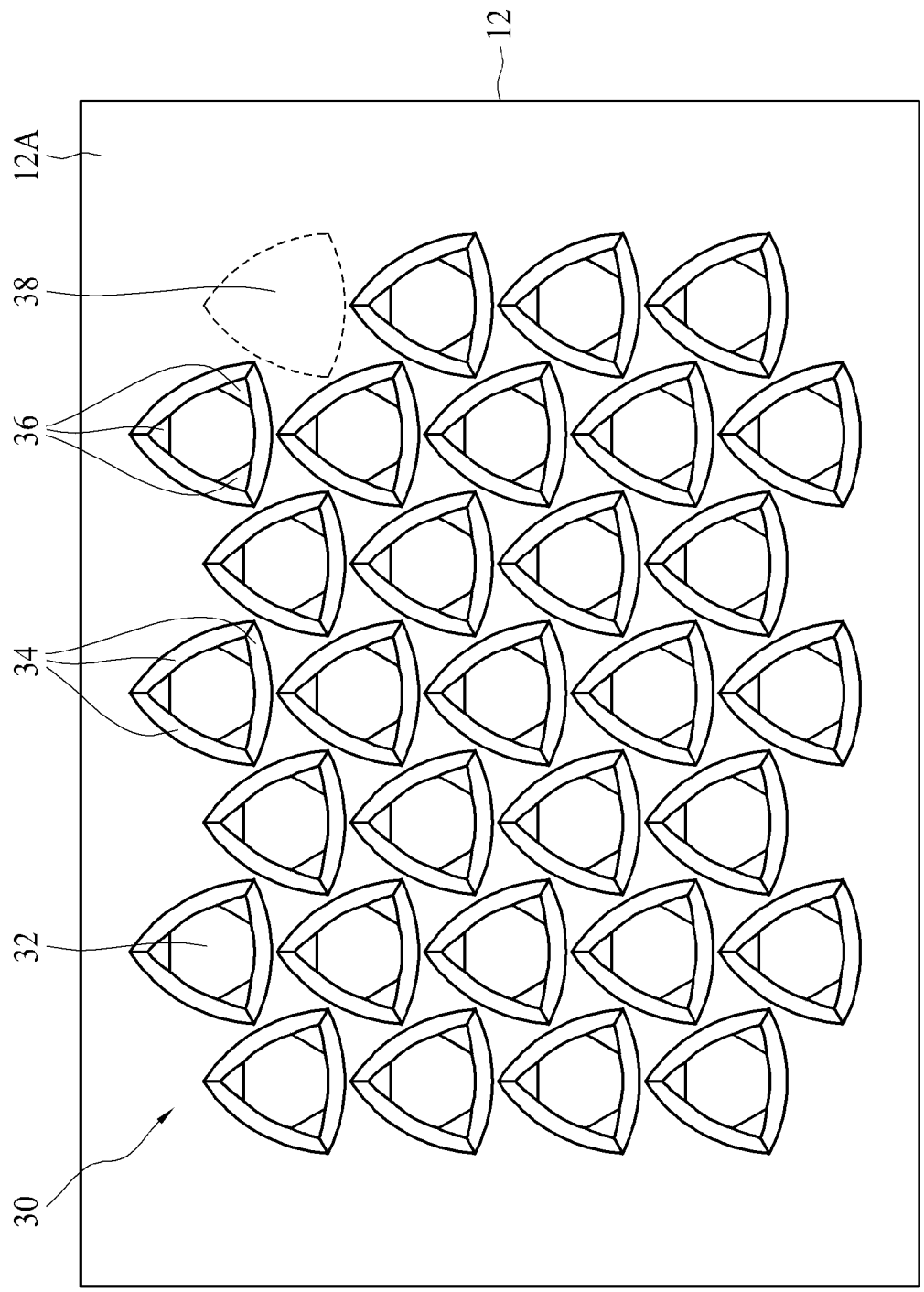
FIG. 3 is a top view of the substrate according to the first embodiment of the present disclosure.
Figure 4:
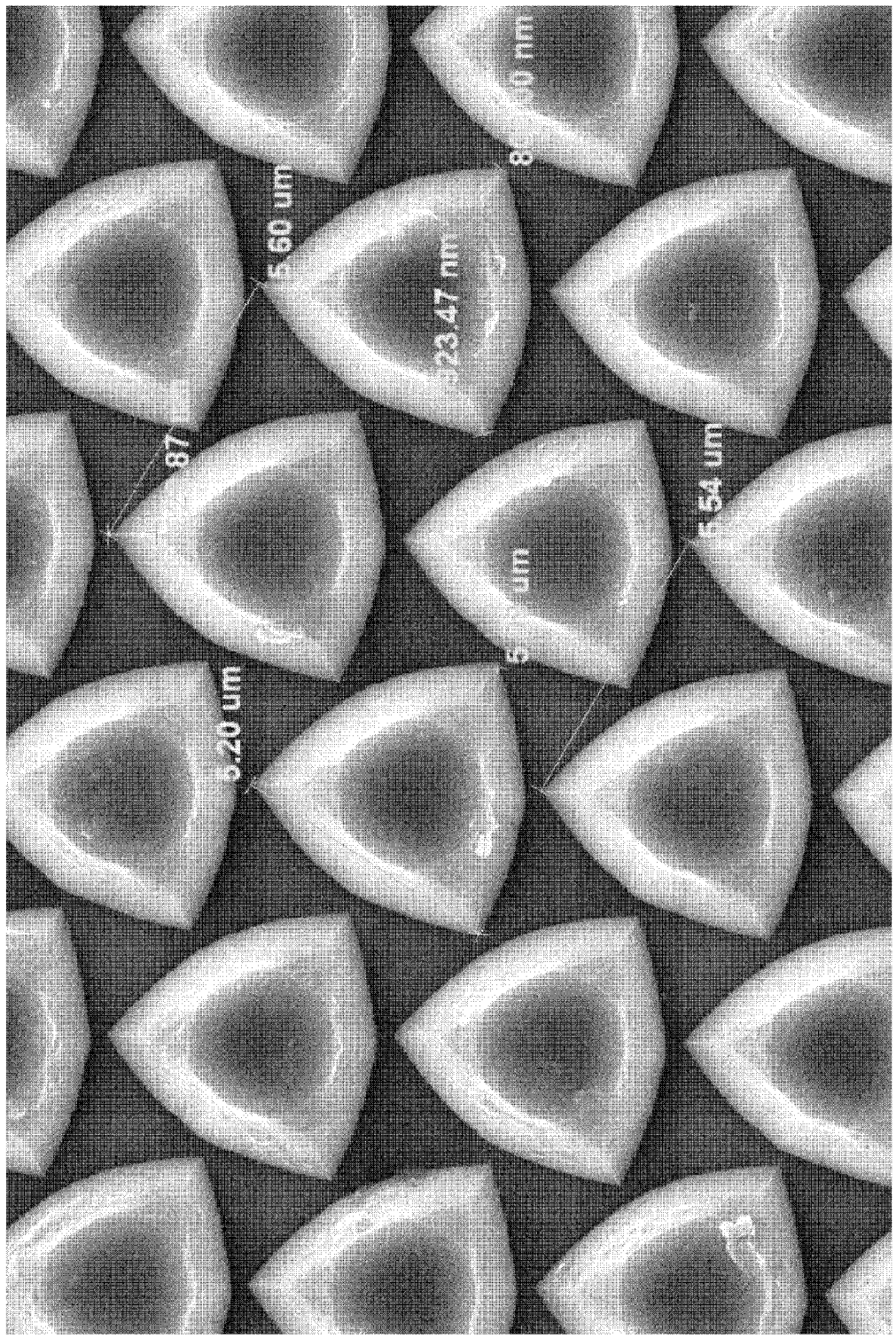
FIG. 4 is a scanning electron microscopy image of the substrate according to the first embodiment of the present disclosure.

FIG. 3 is a top view of the substrate 12 according to the first embodiment of the present disclosure, and FIG. 4 is a scanning electron microscopy image of the substrate 12 according to the first embodiment of the present disclosure. In one embodiment of the present disclosure, the substrate 12 has an upper surface 12A with the bumps 30 positioned over the upper surface 12A in a periodic manner. The bumps 30 are positioned in a plurality of odd rows and a plurality of even rows, and each of the bumps 30 in the even rows is positioned at an interval between adjacent two bumps 30 in the odd rows. The height of the bumps 30 is between 0.5 and 5 microns, the interval between the adjacent two bumps 30 is between 0.5 and 10 microns, and the width of the bumps 30 is between 0.5 and 5 microns.

Each bump 30 has a top plane 32, three wall surfaces 34, and three inclined surfaces 36 sandwiched between the top plane 32 and the wall surfaces 34, wherein each of the inclined surfaces 36 is between two of the wall surfaces 36. The wall surfaces 34 and the inclined surfaces 36 of the bump 30 have different inclined angles, which is the included angle between the upper surface 12A and the wall surface 34 (or the inclined surface 36). The wall surface 34 and the inclined surface 36 are connected, and the included angle between the inclined surface 36 and the wall surface 34 is between 90 and 180 degrees. In addition, the bump 30 has a base surface 38 having three corners, and the connection of the corners is arc-shaped, i.e., the wall surface 34 is arc-shaped.

Figure 5:
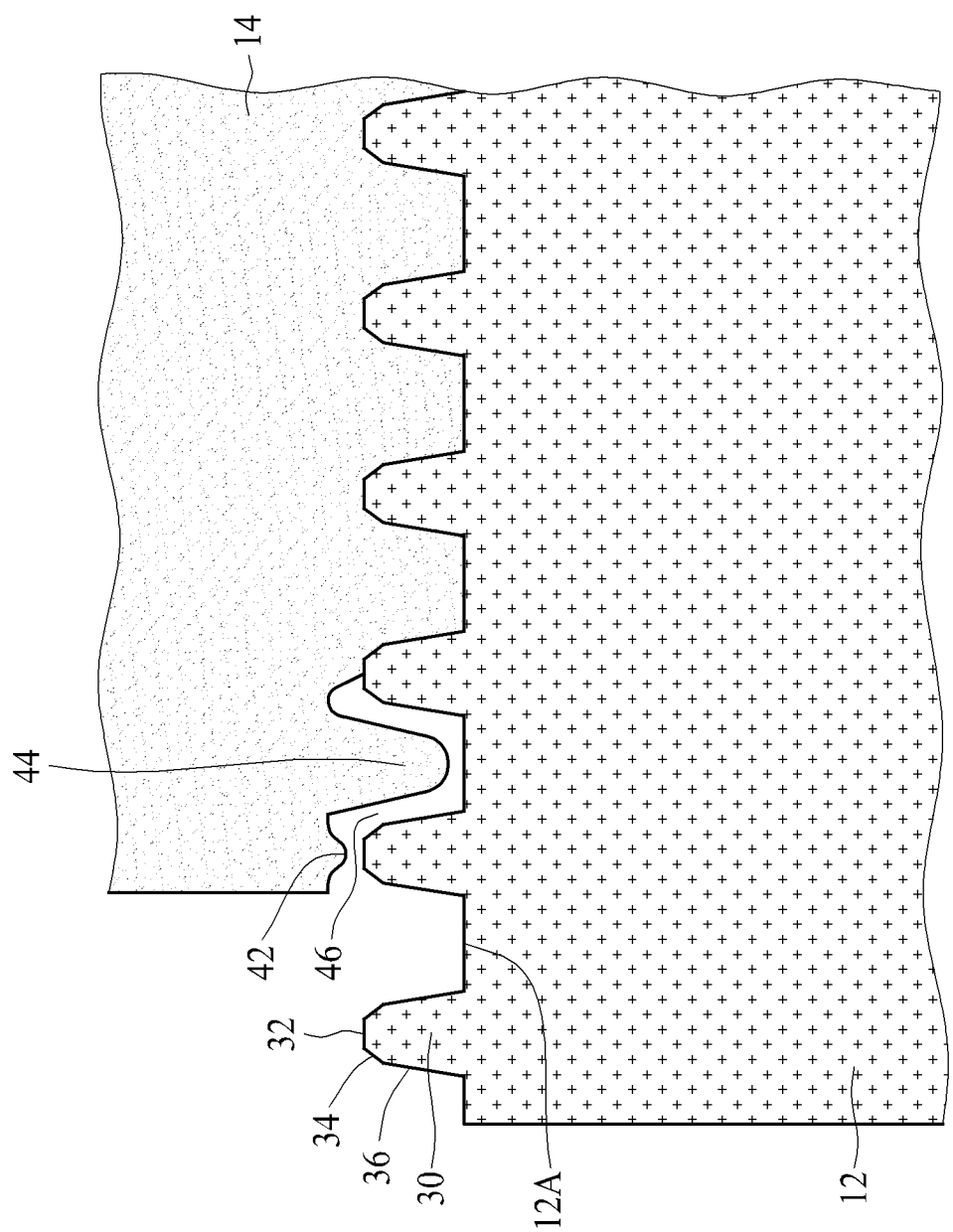
FIG. 5 is a close-up cross-sectional view along the line 1-1 in FIG. 1 according to one embodiment of the present disclosure.
Figure 6:
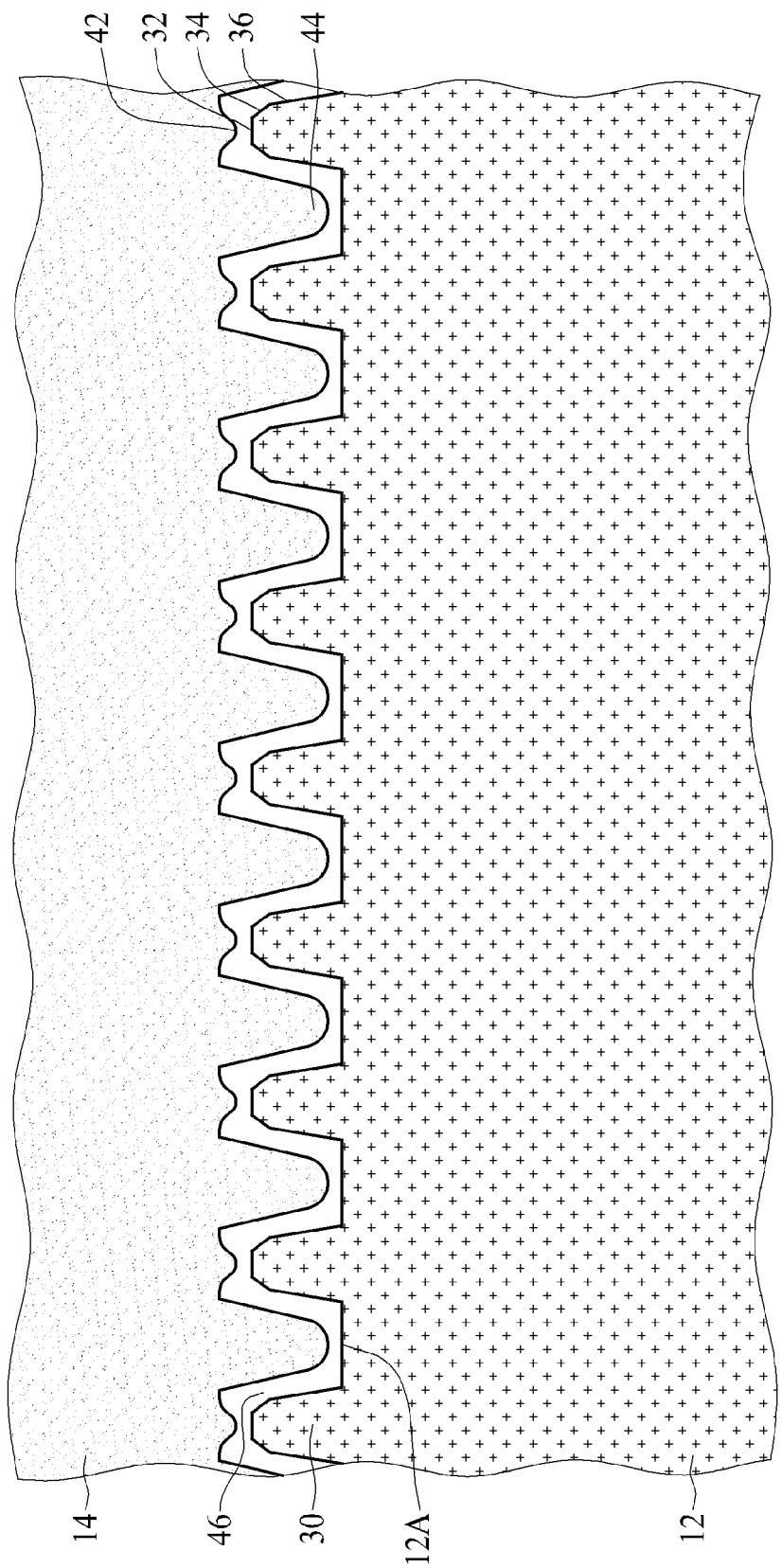
FIG. 6 is a close-up cross-sectional view along the line 2-2 in FIG. 1 according to one embodiment of the present disclosure.
Figure 7:
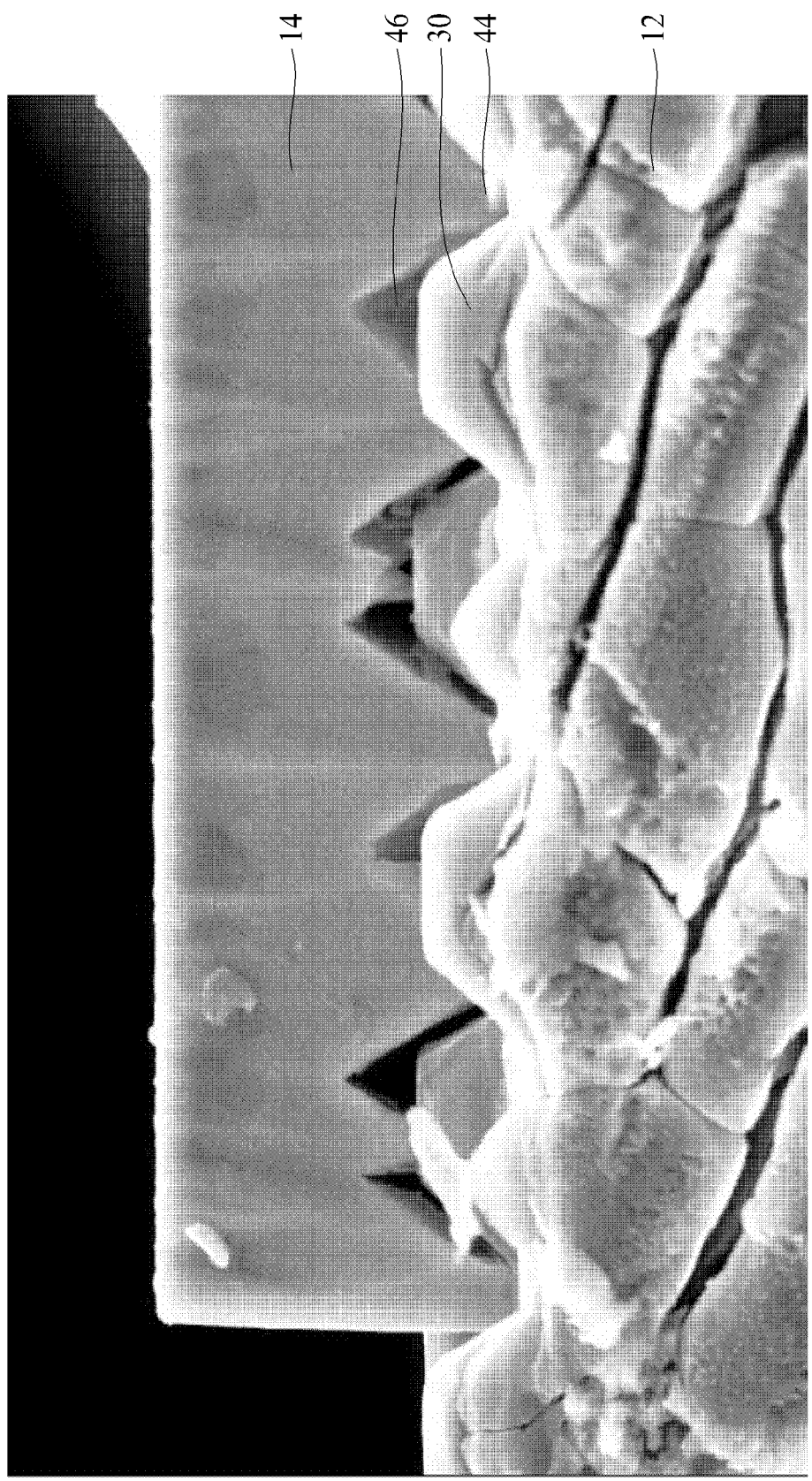
FIG. 7 is a scanning electron microscopy image on the close-up area.

FIG. 5 is a close-up cross-sectional view along the cross-sectional line 1-1 in FIG. 1, FIG. 6 is a close-up cross-sectional view along the cross-sectional line 2-2 in FIG. 1, and FIG. 7 is a scanning electron microscopy image on the close-up area according to one embodiment of the present disclosure. In one embodiment of the present disclosure, the first conductive type semiconductor layer 14 includes a plurality of protrusions 44 each facing a portion of the upper surface 12A of the substrate 12 between the bumps 30. Furthermore, the first conductive type semiconductor layer 14 may optionally include a plurality of projections 42 each facing the top plane 32 of the bumps 30. In one embodiment of the present disclosure, the protrusions 44 are positioned in a ring manner at a peripheral region 40 of the first conductive type semiconductor layer 14, and the width of the peripheral region 40 is between 5 and 10 microns, as shown in FIG. 1.

In one embodiment of the present disclosure, the protrusions 44 are spaced apart from the bumps 30 and the upper surface 12A by a gap such as an air gap 46. Furthermore, the projections 42 are spaced apart from the top plane 32 of the bumps 30 by the air gap 46. The projections 42, the protrusions 44, the air gap 46, the top plane 32, the wall surfaces 34 and the inclined surfaces 36 are configured to scatter and/or diffract the light beams generated by the light-emitting structure 16 to the outside of the semiconductor light-emitting device 10. Consequently, the internal total reflection of the light beams in the light-emitting device 10 can be dramatically decreased to prevent the light beams from being adsorbed by the light-emitting structure 16, so as to improve the light extraction efficiency.

Figure 8:
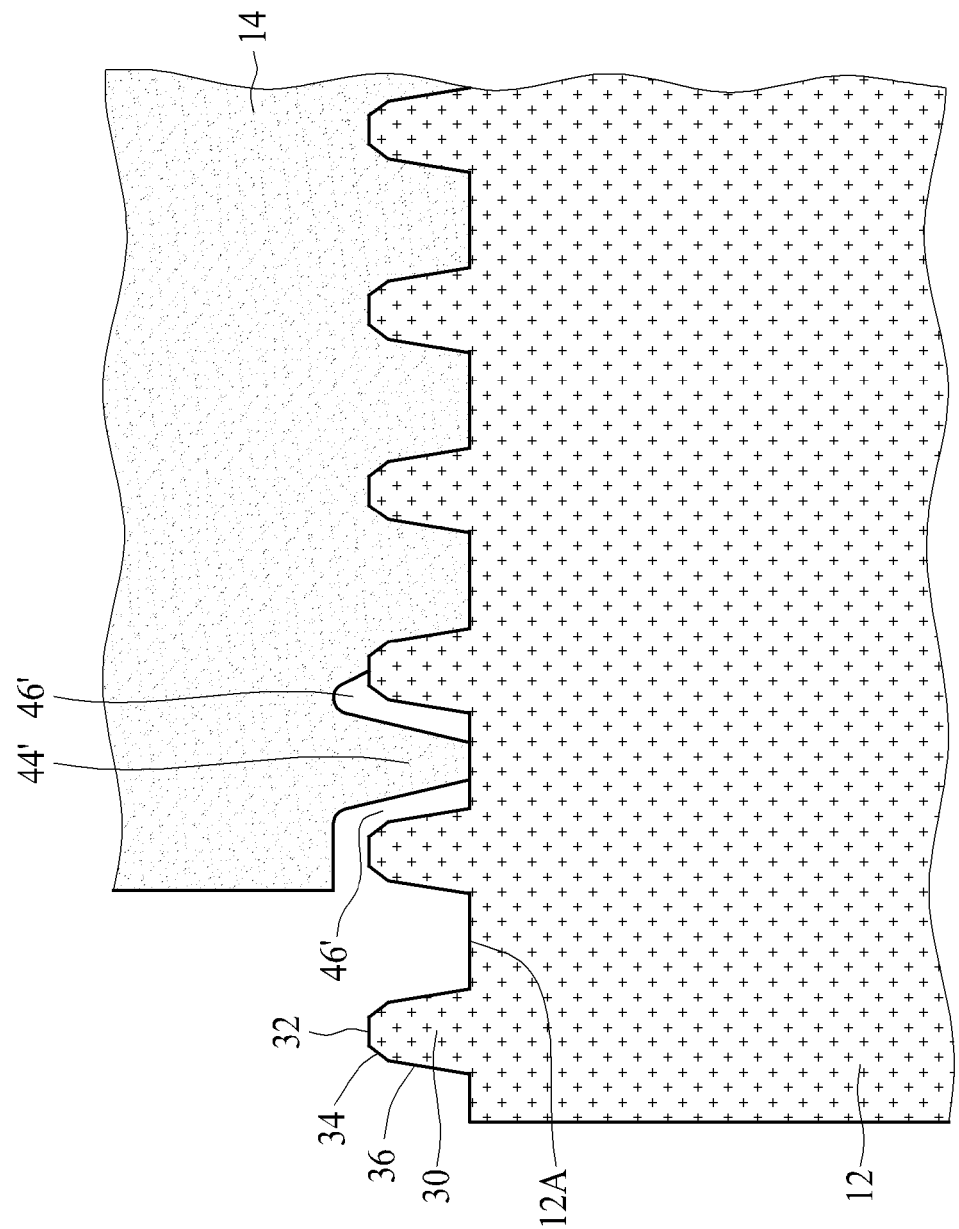
FIG. 8 is a close-up cross-sectional view along the line 1-1 in FIG. 1 according to another embodiment of the present disclosure.
Figure 9:
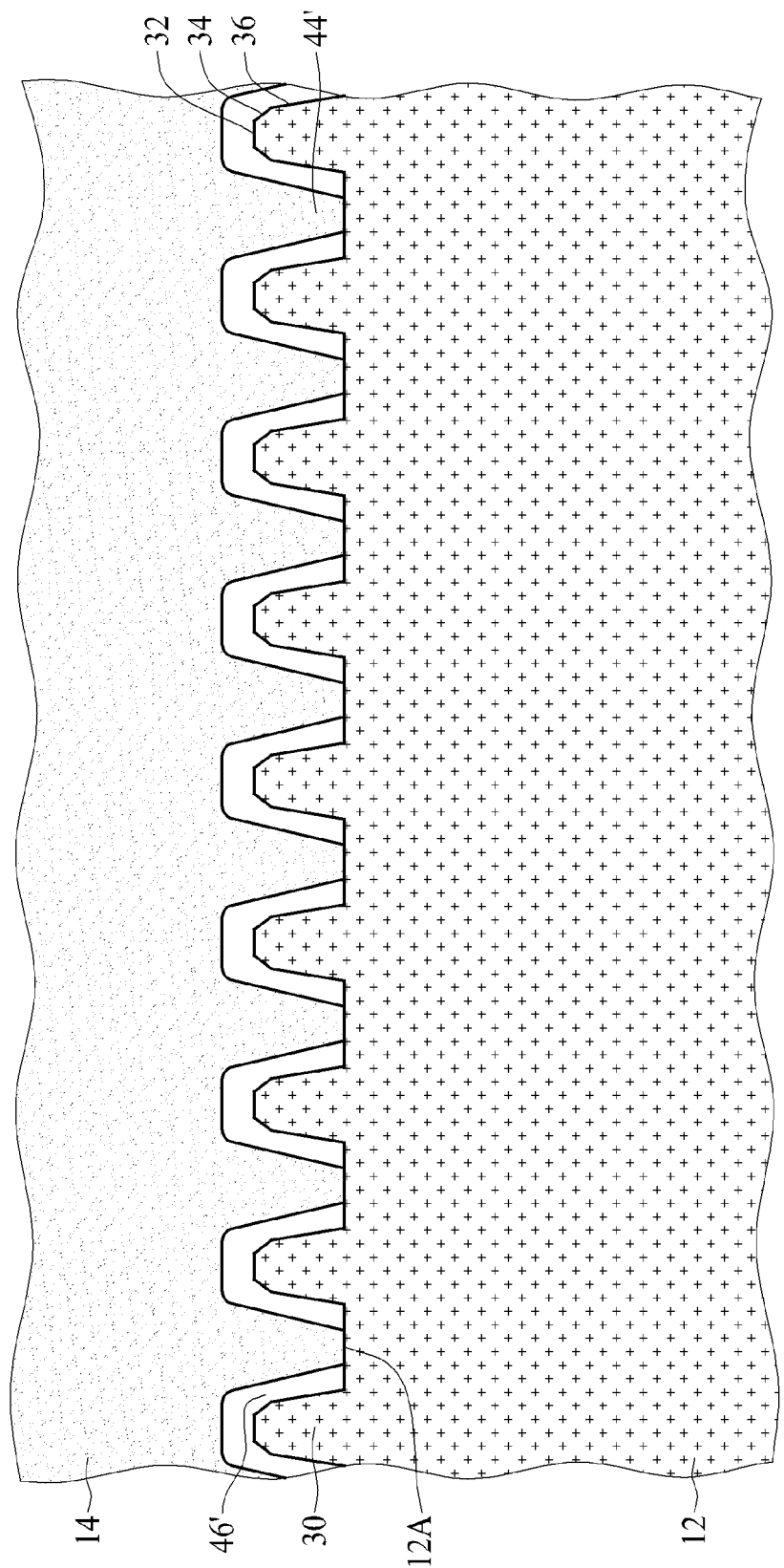
FIG. 9 is a close-up cross-sectional view along the line 2-2 in FIG. 1 according to another embodiment of the present disclosure.

FIG. 8 is a close-up cross-sectional view along the cross-sectional line 1-1 in FIG. 1, and FIG. 9 is a close-up cross-sectional view along the cross-sectional line 2-2 in FIG. 1 according to another embodiment of the present disclosure. In one embodiment of the present disclosure, the first conductive type semiconductor layer 14 includes a plurality of protrusions 44' each facing a portion of the upper surface 12A of the substrate 12 between the bumps 30, the protrusions 44' are positioned in a ring manner at a peripheral region 40 of the first conductive type semiconductor layer 14, and the width of the peripheral region 40 is between 5 and 10 microns, as shown in FIG. 1. Furthermore, the first conductive type semiconductor layer 14 may optionally include a plurality of projections (not shown in FIG. 8 and FIG. 9) each facing the top plane 32 of the bumps 30, similar to the projection 42 shown in FIG. 5.

In one embodiment of the present disclosure, the protrusions 44' contact the portion of the substrate 12 between the bumps 30, and are spaced apart from the bumps 30 by a gap such as an air gap 46'. Furthermore, the protrusions 44', the air gap 46', the top plane 32, the wall surfaces 34 and the inclined surfaces 36 are configured to scatter and/or diffract the light beams generated by the light-emitting structure 16 to the outside of the semiconductor light-emitting device 10. Consequently, the internal total reflection of the light beams in the light-emitting device 10 can be dramatically decreased to prevent the light beams from being adsorbed by the light-emitting structure 16, so as to improve the light extraction efficiency.

In one embodiment of the present disclosure, the air gap 46 or 46' can be formed by performing a wet etching process after the epitaxy process of the first conductive type semiconductor layer 14. The etchant of the wet etching process may include hydrofluoric acid, nitric acid, phosphoric acid, base solution, or mixture of base solution and alcohol, which etches the first conductive type semiconductor layer 14 along the interface between the bumps 30 of the substrate 12 and the first conductive type semiconductor layer 14. The projections 42 may be removed by the wet etching process such that the first conductive type semiconductor layer 14 only has the protrusion 44 or 44' facing the substrate 12.

In one embodiment of the present disclosure, the substrate 12 includes transparent insulation material such as sapphire, silicon, or silicon carbide; the n-type semiconductor layer 14, the light-emitting structure 16 and the p-type semiconductor layer 18 may include III-V material selected from the group consisting of AlGaN, GaN, InGaN, AlGaInN, GaP, or GaAsP; the contact layer 20 includes III-V material such as such as AlGaN, GaN, InGaN, AlGaInN, GaP, or GaAsP; the transparent conductive layer 22 includes indium oxide, tin oxide or indium tin oxide; and the light-emitting structure 16 may include the quantum well or multi-quantum well structure sandwiched between a p-cladding layer and an n-cladding layer over the n-type semiconductor layer 114. In addition, the n-type semiconductor layer 14, the light-emitting structure 16 and the p-type semiconductor layer 18 may include II-VI material selected from the group consisting of ZnCdSe, ZnMgSe, ZnBaSe, ZnBeSe, ZnCaSe, ZnSrSe, ZnCdSSe, ZnMgSSe, ZnCdTe, ZnMgTe, ZnBaTe, ZnBeTe, ZnCaTe, ZnSrTe, ZnCdSTe and ZnMgSTe. In particular, the epitaxy machine can be used to prepare these layers over the substrate 12.

In one embodiment of the present disclosure, the top plane 32 is a C-plane (0,0,1) substantially parallel to the upper surface 12A of the substrate 12. The preparation of the bumps 30 may include the steps of forming a mask having a plurality of patterns covering a portion of the substrate, and performing an etching process to remove a portion of the substrate not covered by the mask to form the bumps 30 under the patterns. In one embodiment of the present disclosure, the etching process is a wet etching process using an etchant including phosphoric acid.

Figure 10:
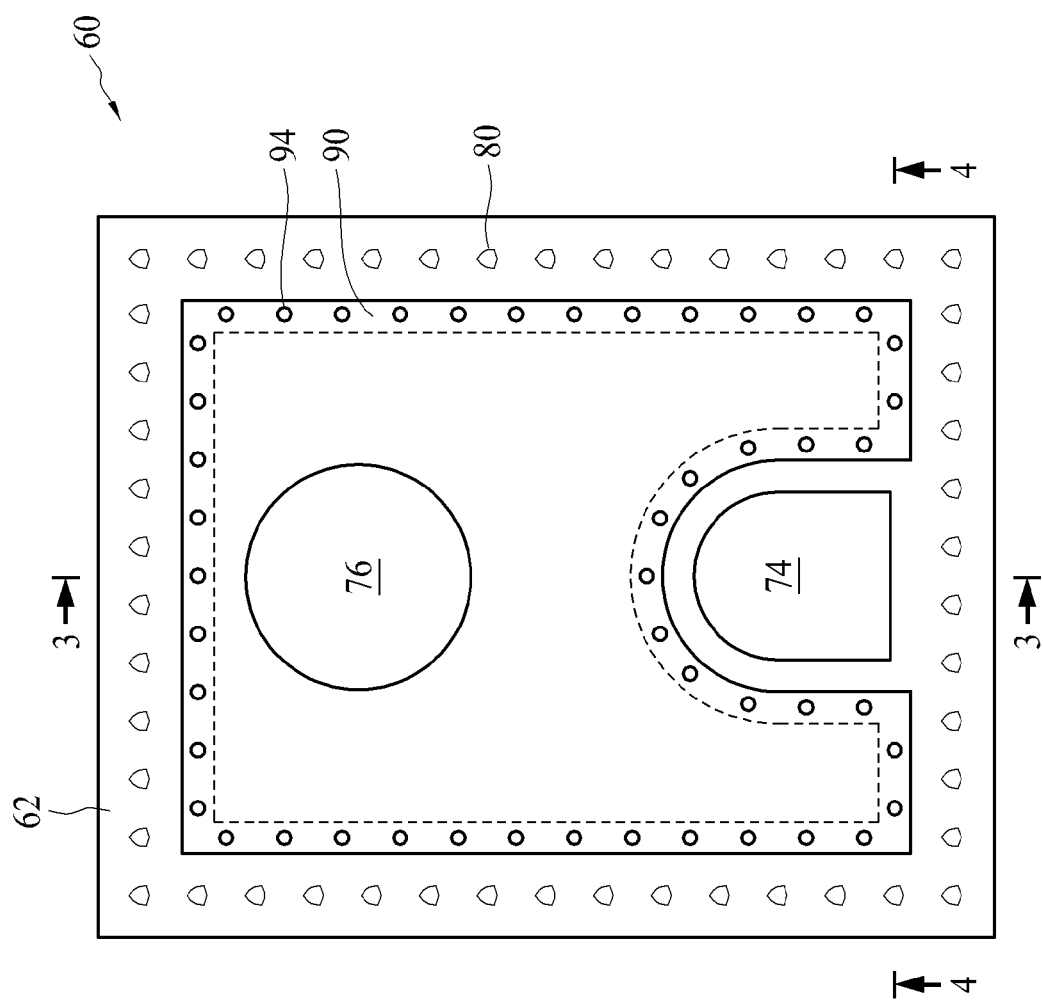
FIG. 10 is a top view of a semiconductor light-emitting device according to a second embodiment of the present disclosure.
Figure 11:
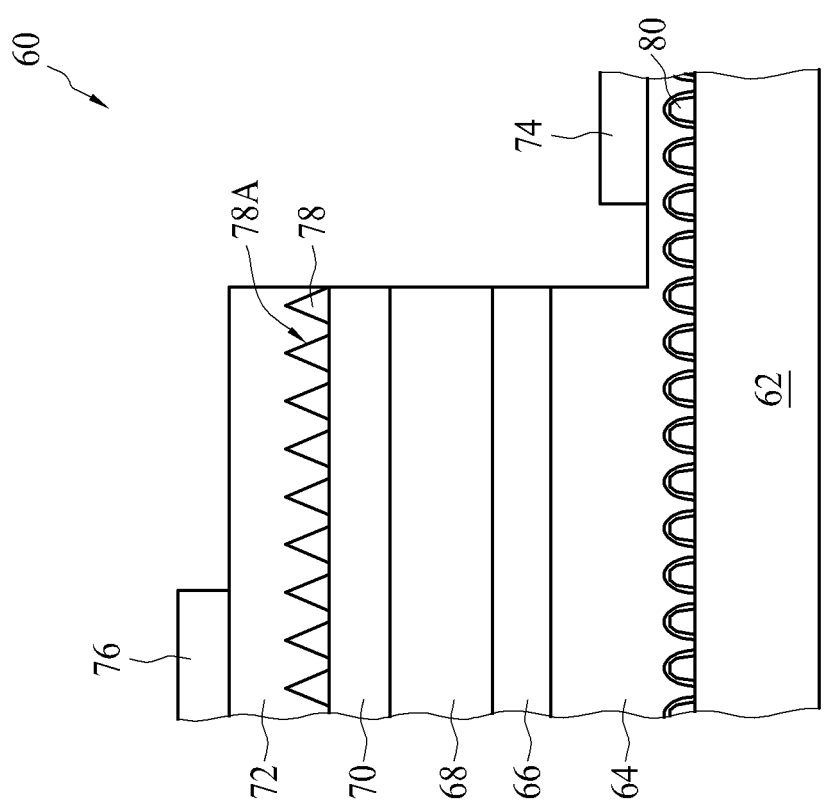
FIG. 11 is a cross-sectional view along the line 3-3 in FIG. 10.

FIG. 10 is a top view of a semiconductor light-emitting device 60 according to a second embodiment of the present disclosure, and FIG. 11 is a cross-sectional view along the cross-sectional line 3-3 in FIG. 10. The semiconductor light-emitting device 60 comprises a substrate 62, an n-type semiconductor layer 64 positioned over the substrate 62, a light-emitting structure 66 positioned over the n-type semiconductor layer 64, a p-type semiconductor layer 68 positioned over the light-emitting structure 66, a contact layer 70 positioned over the p-type semiconductor layer 68, a crystal layer 78 positioned over the contact layer 70, a transparent conductive layer 72 positioned over the crystal layer 78, a first electrode 74 positioned over the n-type semiconductor layer 64, and a second electrode 76 positioned over the transparent conductive layer 72. In one embodiment of the present disclosure, the crystal layer 78 includes a plurality of bumps 78A configured to improve the propagation of the light beams from the light-emitting structure 66 to the outside of the light-emitting device 60 so as to increase the light-emitting efficiency.

Figure 12:
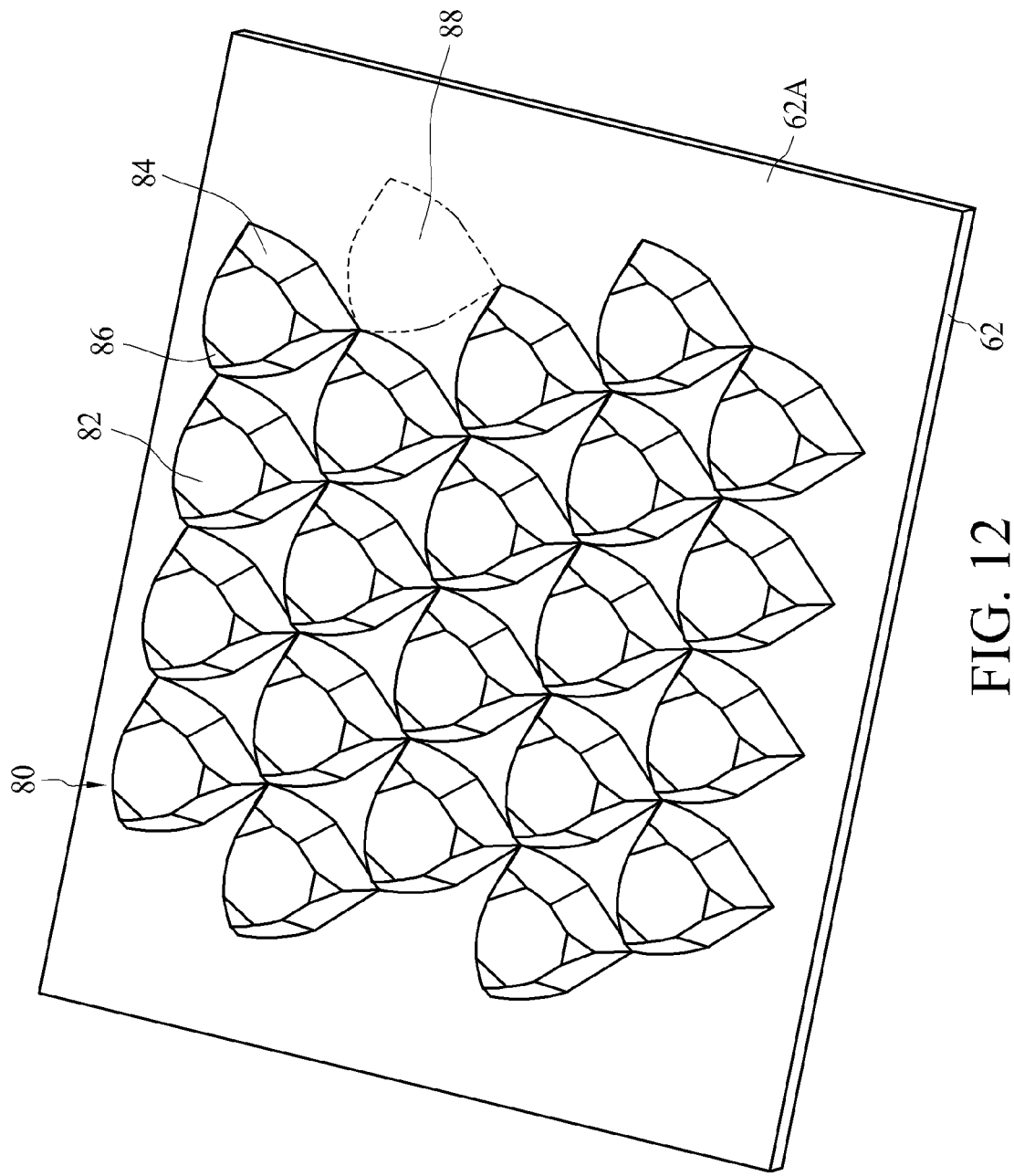
FIG. 12 is a full view of the substrate of the semiconductor light-emitting device of FIG. 10.

FIG. 12 is a full view of the substrate 62 according to the second embodiment of the present disclosure. In one embodiment of the present disclosure, the substrate 62 has an upper surface 62A and a plurality of bumps 80 positioned over the upper surface 62A in a periodic manner. The bumps 80 are positioned in a plurality of odd rows and a plurality of even rows, and each of the bumps 80 in the even rows is positioned at an interval between adjacent two bumps 80 in the odd rows. The height of the bumps 80 is between 0.5 and 5 microns, the interval between the adjacent two bumps 80 is between 0.5 and 10 microns, and the width of the bumps 80 is between 0.5 and 5 microns.

Each bump 80 has a top plane 82, five wall surfaces 84, and three inclined surfaces 86 sandwiched between the top plane 82 and the wall surfaces 84, wherein each of the inclined surfaces 86 is between two of the wall surfaces 84. The wall surface 84 and the inclined surface 86 of the bump 80 have different inclined angles, which is the included angle between the upper surface 62A and the wall surface 84 (or the inclined surface 86). The wall surface 84 and the inclined surface 86 are connected, and the included angle between the inclined surface 86 and the wall surface 84 is between 90 and 180 degrees. In addition, the bump 80 has a base surface 88 having five corners, and the connections of the corners is arc-shaped, i.e., the wall surface 84 is arc-shaped.

Figure 13:
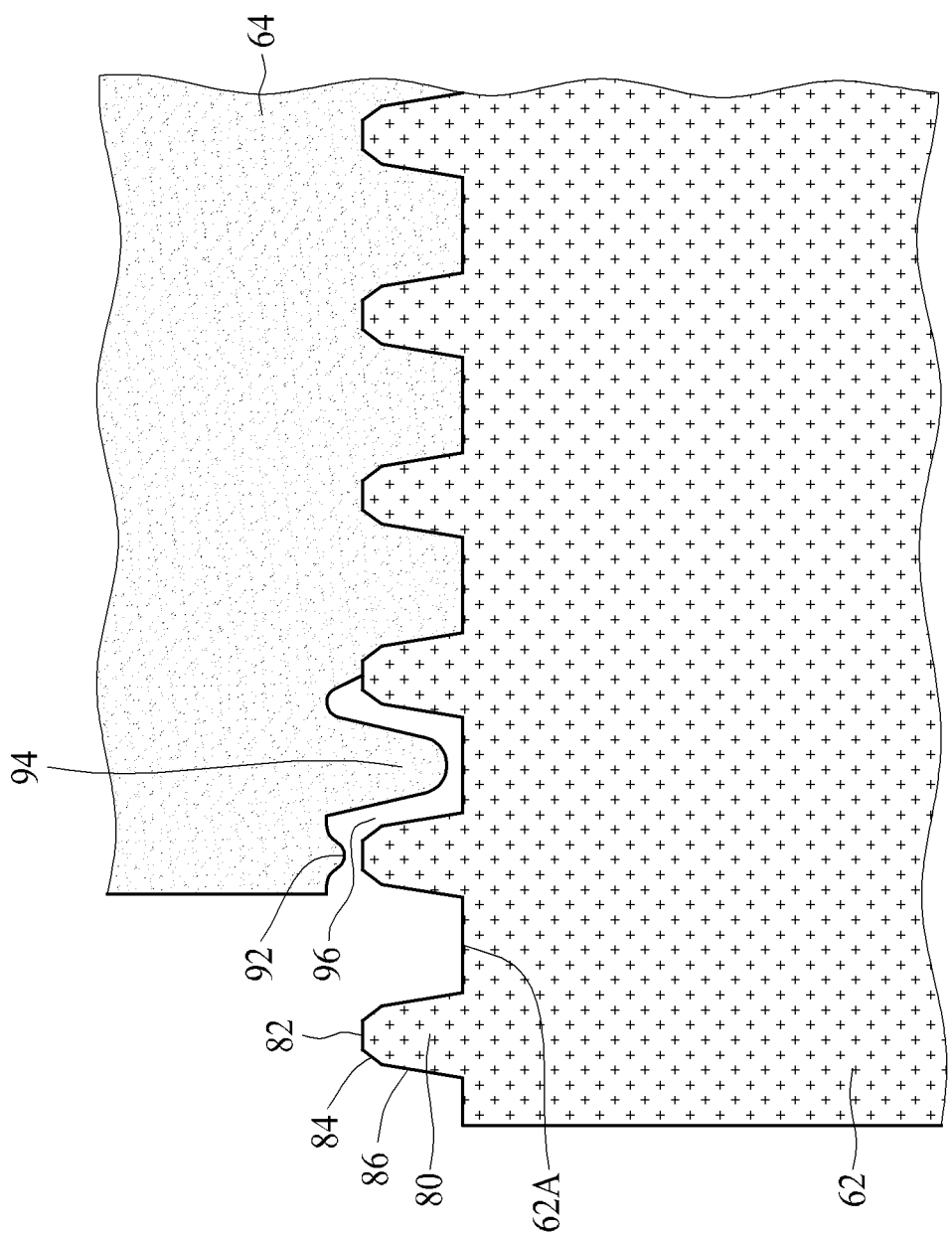
FIG. 13 is a close-up cross-sectional view along the line 3-3 in FIG. 10 according to one embodiment of the present disclosure.
Figure 14:
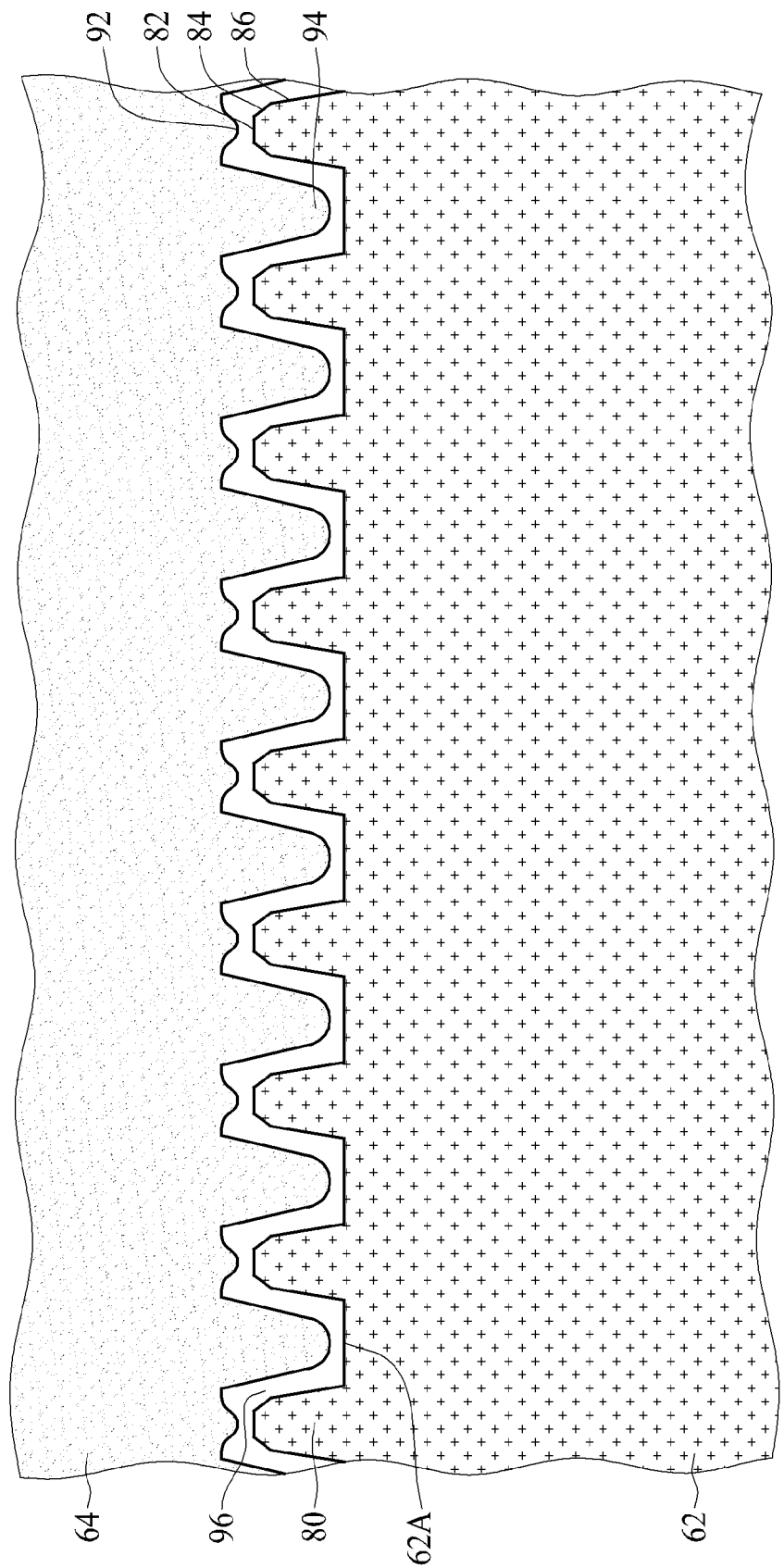
FIG. 14 is a close-up cross-sectional view along the line 4-4 in FIG. 10 according to one embodiment of the present disclosure.

FIG. 13 is a close-up cross-sectional view along the cross-sectional line 3-3 in FIG. 10, and FIG. 14 is a close-up cross-sectional view along the cross-sectional line 4-4 in FIG. 10 according to one embodiment of the present disclosure. In one embodiment of the present disclosure, the first conductive type semiconductor layer 64 includes a plurality of protrusions 94 each facing a portion of the upper surface 62A of the substrate 62 between the bumps 80. Furthermore, the first conductive type semiconductor layer 64 may optionally includes a plurality of projections 92 each facing the top plane 82 of the bumps 80. In one embodiment of the present disclosure, the protrusions 94 are positioned in a ring manner at a peripheral region 90 of the first conductive type semiconductor layer 64, and the width of the peripheral region 90 is between 5 and 10 microns, as shown in FIG. 13.

In one embodiment of the present disclosure, the protrusions 94 are spaced apart from the bumps 80 and the portion of the substrate 62 between the bumps 80 by a gap such as an air gap 96. Furthermore, the projections 92 are spaced apart from the top plane 82 of the bumps 80 by the air gap 96. The projections 92, the protrusion 94, the air gap 96, the top plane 82, the wall surfaces 84 and the inclined surfaces 86 are configured to scatter and/or diffract the light beams generated by the light-emitting structure 66 to the outside of the light-emitting device 60. Consequently, the internal total reflection of the light beams in the light-emitting device 60 can be dramatically decreased to prevent the light beams from being adsorbed by the light-emitting structure 66, so as to improve the light extraction efficiency.

Figure 15:
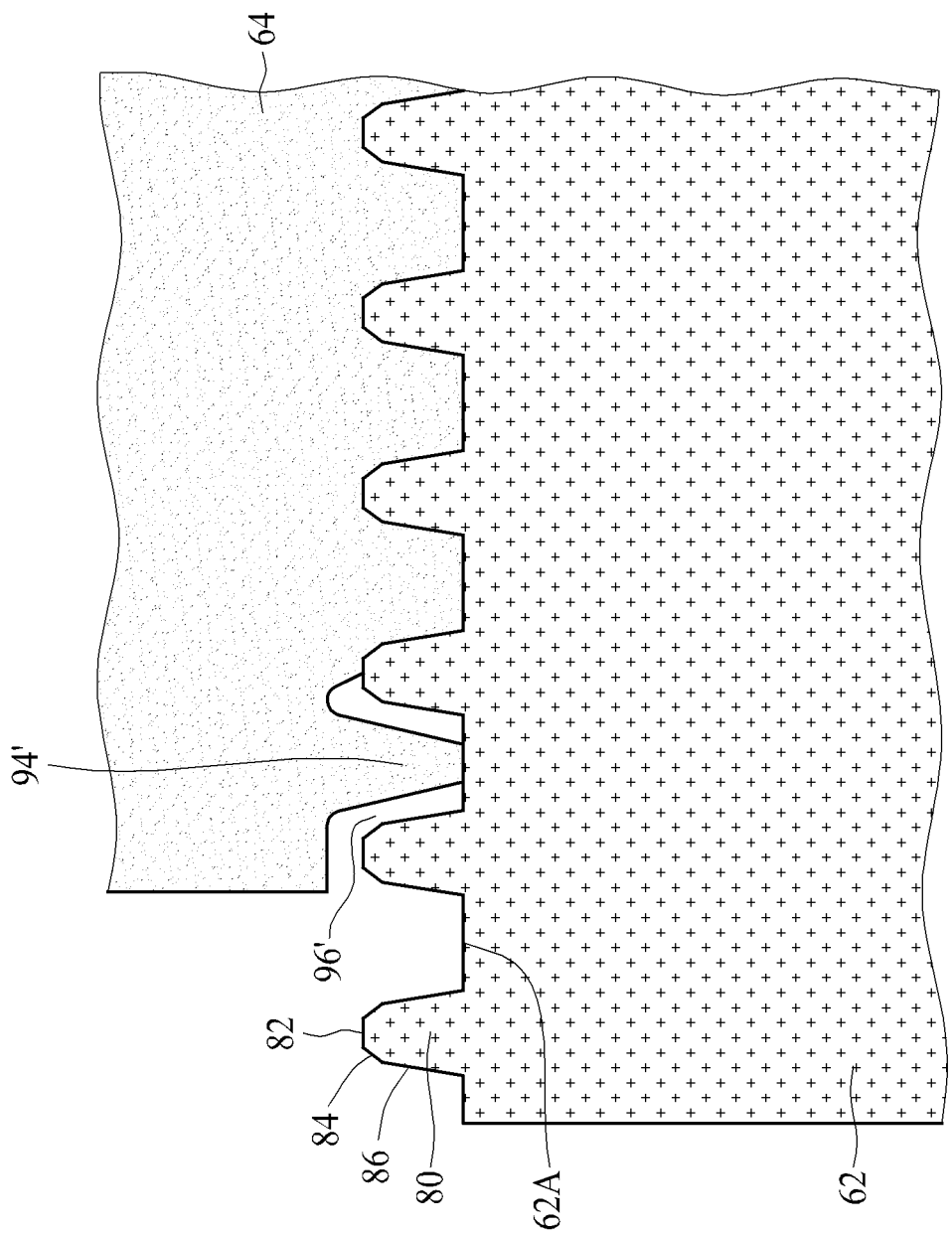
FIG. 15 is a close-up cross-sectional view along the line 3-3 in FIG. 10 according to another embodiment of the present disclosure.
Figure 16:
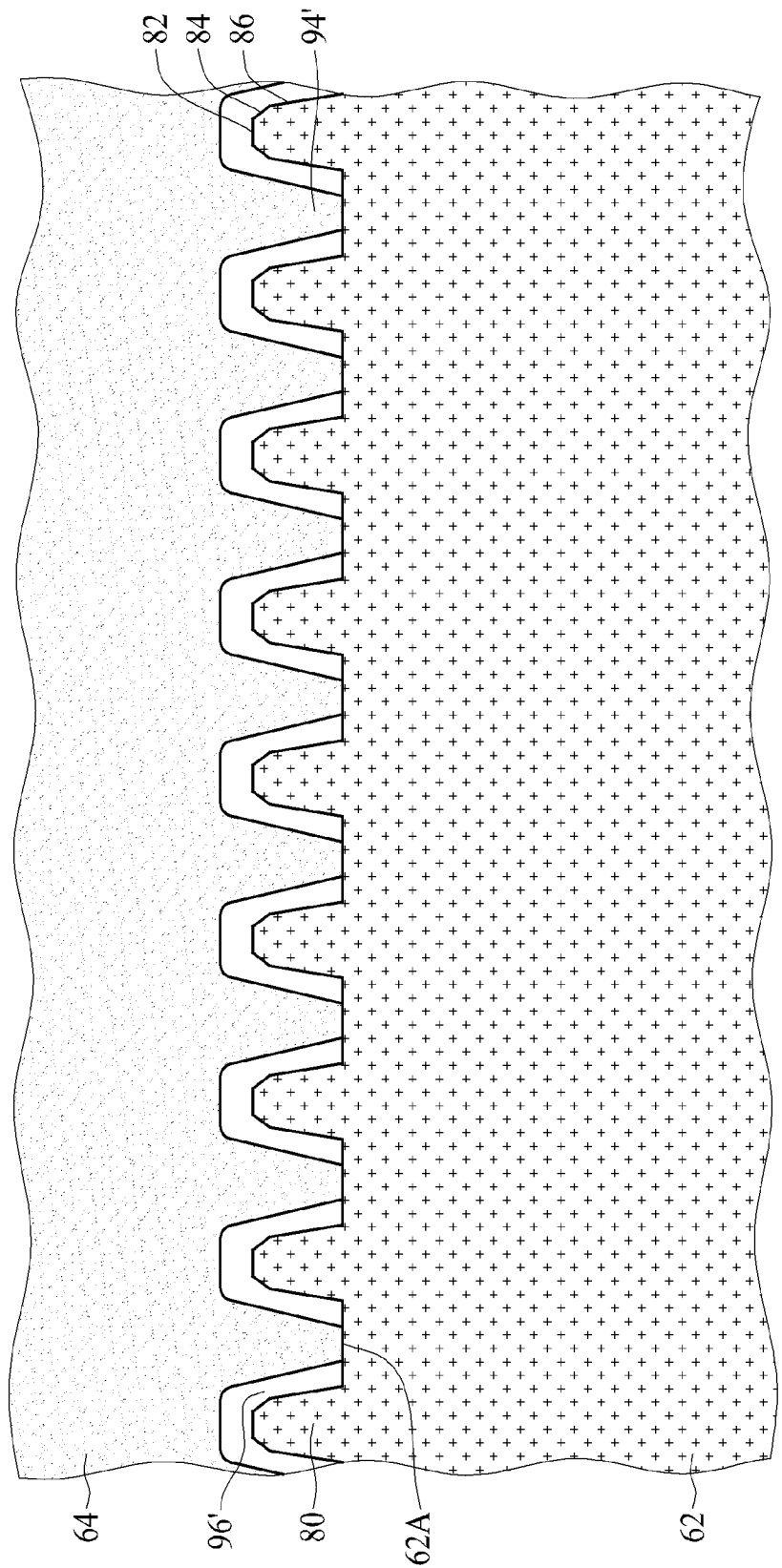
FIG. 16 is a close-up cross-sectional view along the line 4-4 in FIG. 10 according to another embodiment of the present disclosure.

FIG. 15 is a close-up cross-sectional view along the cross-sectional line 3-3 in FIG. 10, and FIG. 16 is a close-up cross-sectional view along the cross-sectional line 4-4 in FIG. 10 according to another embodiment of the present disclosure. In one embodiment of the present disclosure, the first conductive type semiconductor layer 64 includes a plurality of protrusions 94' each facing a portion of the upper surface 62A of the substrate 62 between the bumps 80, the protrusions 94' are positioned in a ring manner at a peripheral region 90 of the first conductive type semiconductor layer 64, and the width of the peripheral region 90 is between 5 and 10 microns, as shown in FIG. 10. Furthermore, the first conductive type semiconductor layer 64 may optionally include a plurality of projections (not shown in FIG. 15 or FIG. 16) each facing the top plane 82 of the bumps 80, similar to the projection 92 shown in FIG. 13.

In one embodiment of the present disclosure, the protrusions 94' contact the portion of the substrate 62 between the bumps 80, and are spaced apart from the bumps 80 by a gap such as an air gap 96'. Furthermore, the protrusions 94', the air gap 96', the top plane 82, the wall surfaces 84 and the inclined surfaces 86 are configured to scatter and/or diffract the light beams generated by the light-emitting structure 66 to the outside of the semiconductor light-emitting device 60. Consequently, the internal total reflection of the light beams in the light-emitting device 60 can be dramatically decreased to prevent the light beams from being adsorbed by the light-emitting structure 66, so as to improve the light extraction efficiency.

In one embodiment of the present disclosure, the air gap 96 or 96' can be formed by performing a wet etching process after the epitaxy process of the first conductive type semiconductor layer 64. The etchant of the wet etching process may include hydrofluoric acid, nitric acid, phosphoric acid, base solution, or mixture of base solution and alcohol, which etches the first conductive type semiconductor layer 64 along the interface between the bumps 80 of the substrate 62 and the first conductive type semiconductor layer 64. The projections 92 may be removed by the wet etching process such that the first conductive type semiconductor layer 64 only has the protrusion 94 or 94' facing the substrate 62.

In one embodiment of the present disclosure, the substrate 62 includes transparent insulation material such as sapphire, silicon, or silicon carbide; the n-type semiconductor layer 64, the light-emitting structure 66 and the p-type semiconductor layer 68 may include III-V material selected from the group consisting of AlGaN, GaN, InGaN, AlGaInN, GaP, or GaAsP; the contact layer 70 includes III-V material selected from the group consisting of AlGaN, GaN, InGaN, AlGaInN, GaP, or GaAsP; the transparent conductive layer 72 includes indium oxide, tin oxide or indium tin oxide; and the light-emitting structure 66 may include the quantum well or multi-quantum well structure sandwiched between a p-cladding layer and an n-cladding layer over the n-type semiconductor layer 64. In addition, the n-type semiconductor layer 64, the light-emitting structure 66 and the p-type semiconductor layer 68 may include II-VI material selected from the group consisting of ZnCdSe, ZnMgSe, ZnBaSe, ZnBeSe, ZnCaSe, ZnSrSe, ZnCdSSe, ZnMgSSe, ZnCdTe, ZnMgTe, ZnBaTe, ZnBeTe, ZnCaTe, ZnSrTe, ZnCdSTe and ZnMgSTe. In particular, the epitaxy machine can fabricate these layers over the substrate 62.

In one embodiment of the present disclosure, the top plane 82 is a C-plane (0,0,1) substantially parallel to the upper surface 62A of the substrate 62. The preparation of the bumps 80 may include the steps of forming a mask having a plurality of patterns covering a portion of the substrate, and performing an etching process to remove a portion of the substrate not covered by the mask to form the bumps 80 under the patterns. In one embodiment of the present disclosure, the etching process is a wet etching process using an etchant including phosphoric acid.

Figure 17:
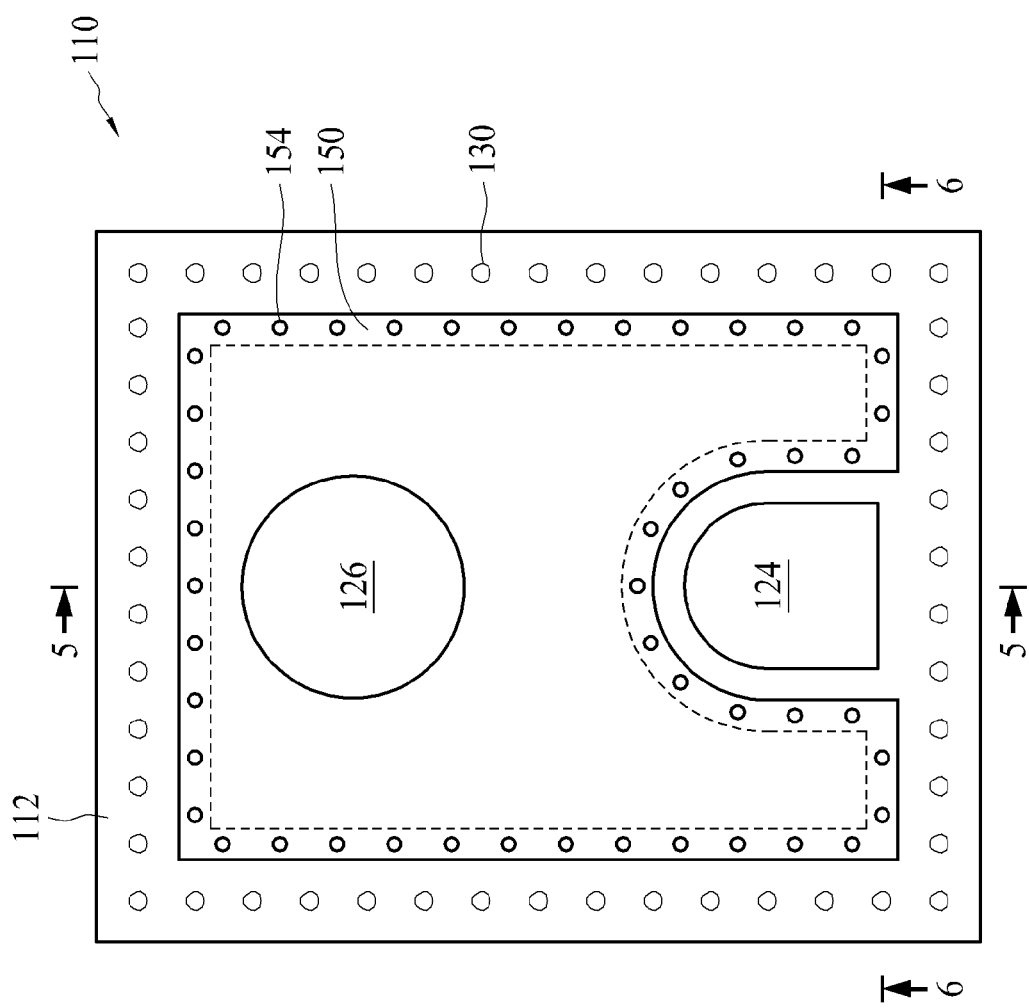
FIG. 17 is a top view of a semiconductor light-emitting device according to a third embodiment of the present disclosure.
Figure 18:
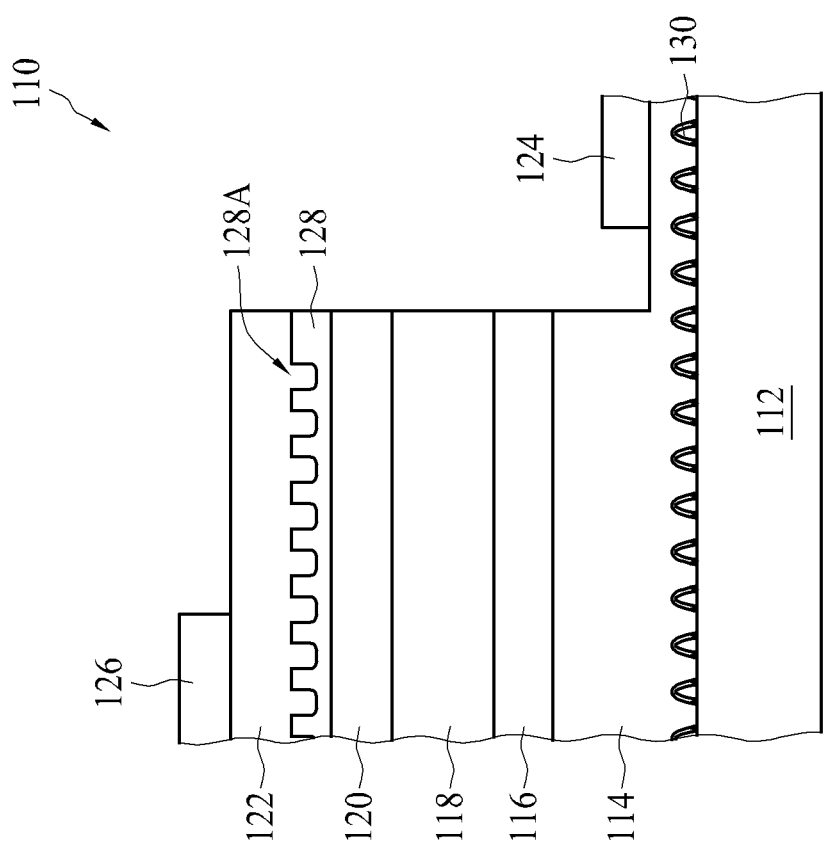
FIG. 18 is a cross-sectional view along the line 5-5 in FIG. 17.

FIG. 17 is a top view of a semiconductor light-emitting device 110 according to a third embodiment of the present disclosure, and FIG. 18 is a cross-sectional view along the cross-sectional line 5-5 in FIG. 17. The semiconductor light-emitting device 110 comprises a substrate 112, an n-type semiconductor layer 114 positioned over the substrate 112, a light-emitting structure 116 positioned over the n-type semiconductor layer 114, a p-type semiconductor layer 118 positioned over the light-emitting structure 116, a contact layer 120 positioned over the p-type semiconductor layer 118, a crystal layer 128 positioned over the contact layer 120, a transparent conductive layer 122 positioned over the crystal layer 128, a first electrode 124 positioned over the n-type semiconductor layer 114, and a second electrode 126 positioned over the transparent conductive layer 122. In one embodiment of the present disclosure, the crystal layer 128 includes a plurality of depressions 128A configured to improve the propagation of the light beams propagating from the light-emitting structure 116 to the outside of the light-emitting device 110 so as to increase the light-emitting efficiency.

Figure 19:
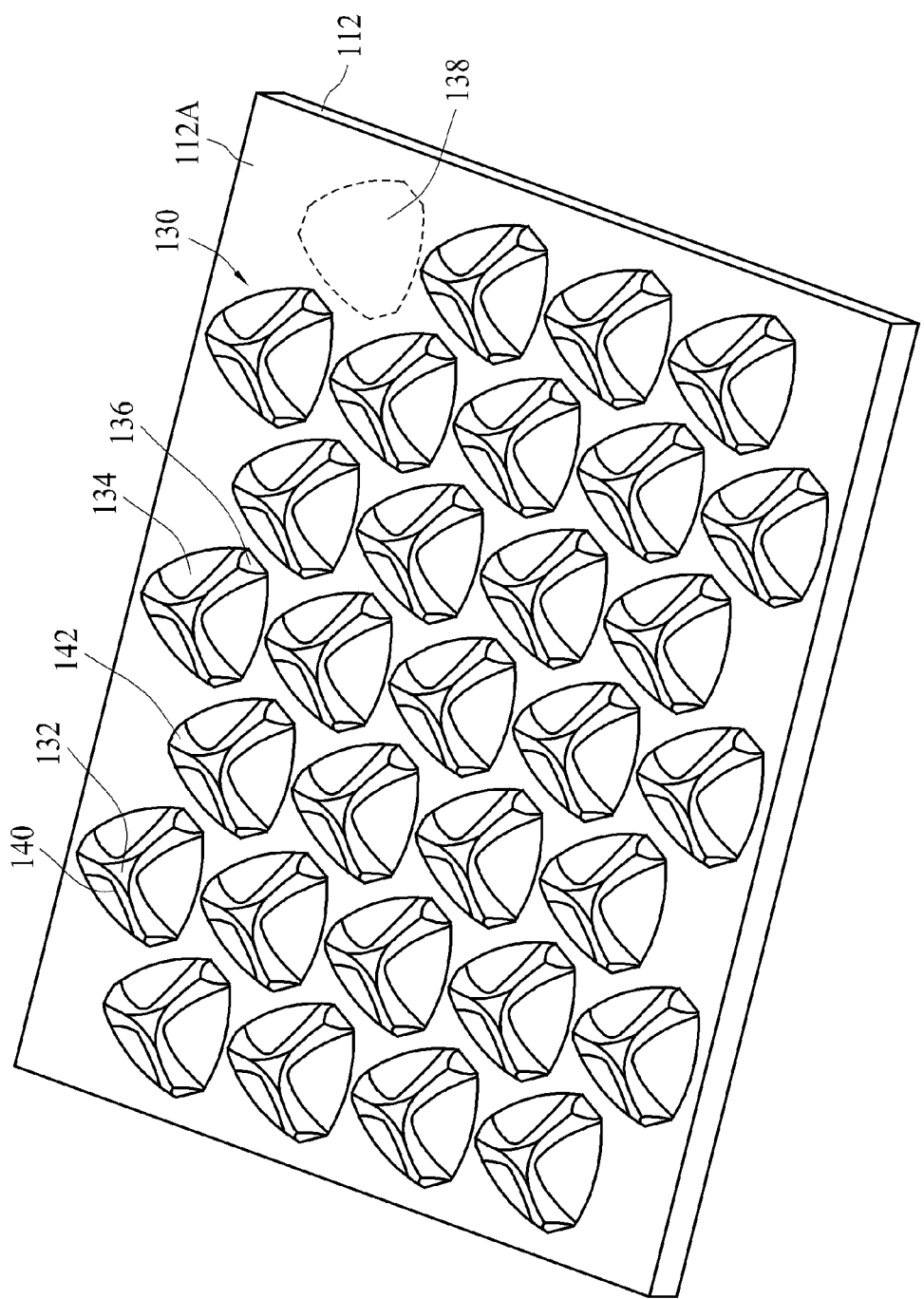
FIG. 19 is a full view of the substrate according to the third embodiment of the present disclosure.
Figure 20:
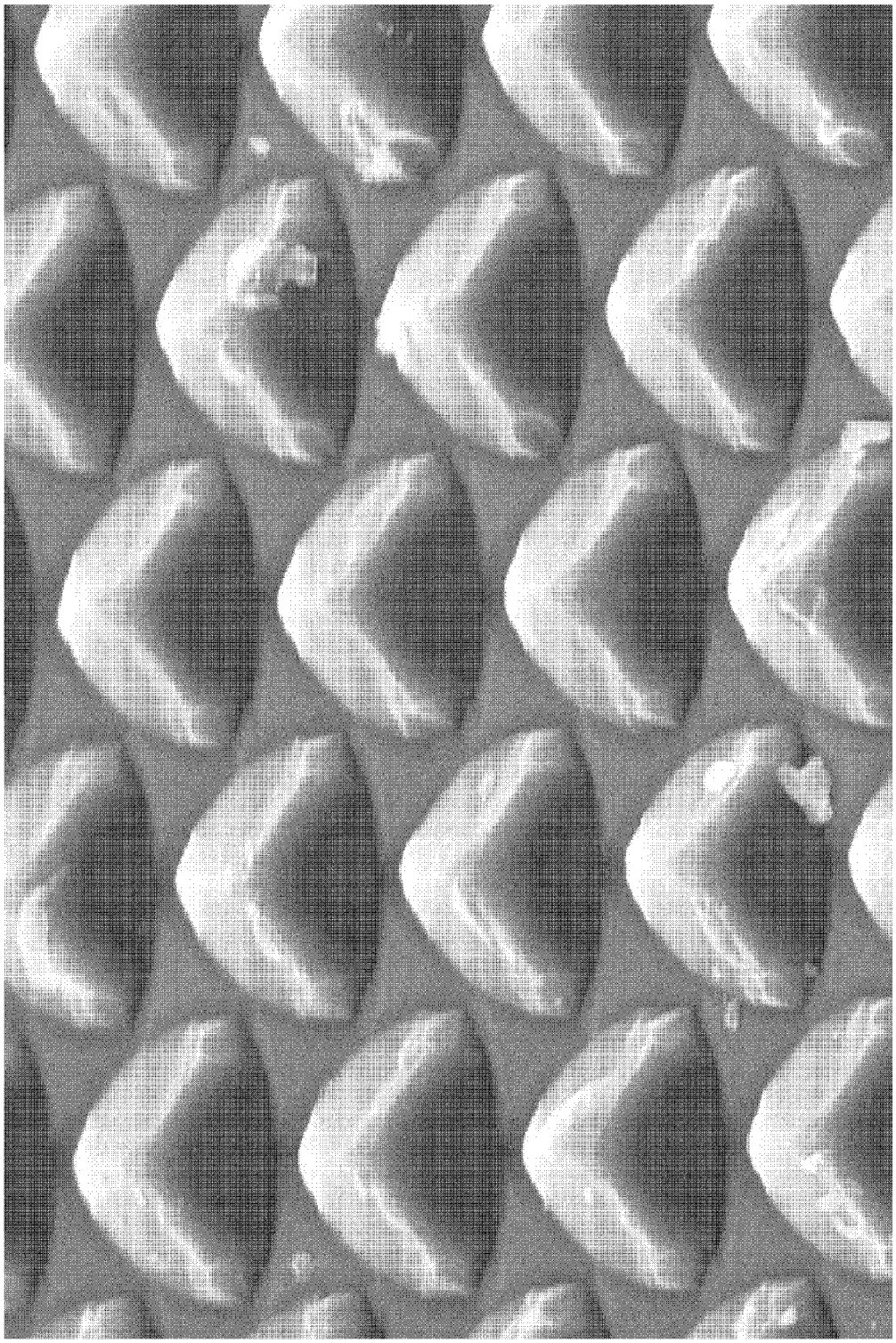
FIG. 20 is a scanning electron microscopy image of the substrate according to the third embodiment of the present disclosure.

FIG. 19 is a full view of the substrate 112 according to the third embodiment of the present disclosure, and FIG. 16 is a scanning electron microscopy image of the substrate 112 according to the third embodiment of the present disclosure. In one embodiment of the present disclosure, the substrate 112 has an upper surface 112A and a plurality of bumps 130 positioned over the upper surface 112A in a periodic manner. The bumps 130 are positioned in a plurality of odd rows and a plurality of even rows, and each of the bumps 130 in the even rows is positioned at an interval between adjacent two bumps 130 in the odd rows. The height of the bumps 130 is between 0.5 and 5 microns, the interval between the adjacent two bumps 130 is between 0.5 and 10 microns, and the width of the bumps 130 is between 0.5 and 5 microns.

Each bump 130 has a top plane 132, a ridge portion 140, a plurality of wall surfaces 134, and a plurality of inclined surfaces 136. The ridge portion 140 has a plurality of branches 142, the wall surfaces 134 are sandwiched between the branches 142, and the inclined surfaces 136 are positioned over free ends of the branches 142, with the free ends being adjacent to the upper surface 112A. In one embodiment of the present disclosure, the ridge portion 140 includes three branches 142, and the bump 130 includes three wall surfaces 134 and three inclined surfaces 136. The top plane 132 of the bump 130 connects the branches 142, i.e., the top plane 133 is sandwiched among the branches 142. In addition, the top plane 132 can be dart-shaped, and the ridge portion 140 is above the wall surface 134.

The wall surface 134 and the inclined surface 136 of the bump 130 have different inclined angles, which is the included angle between the upper surface 112A and the wall surface 134 (or the inclined surface 136). The wall surface 134 and the inclined surface 136 are connected, and the included angle between the inclined surface 136 and the wall surface 134 is between 90 and 180 degrees. The different inclined angles are configured to reflect the light beams generated by the light-emitting structure 116 at different reflection angles. In addition, the bump 130 has a base surface 138 having three corners, and the connection of the corners is arc-shaped, i.e., the wall surface 134 is arc-shaped. The ridge portion 140, the wall surface 134, the inclined surface 136, and the top plane 132 can reflect the light beams generated by the light-emitting structure 116 at any angle to the outside of the light-emitting device 100. Consequently, the repeated internal reflection of the light beams in the light-emitting device 100 is decreased dramatically to prevent the light beams from being adsorbed by the light-emitting structure 116, so as to improve the light extraction efficiency.

Figure 21:
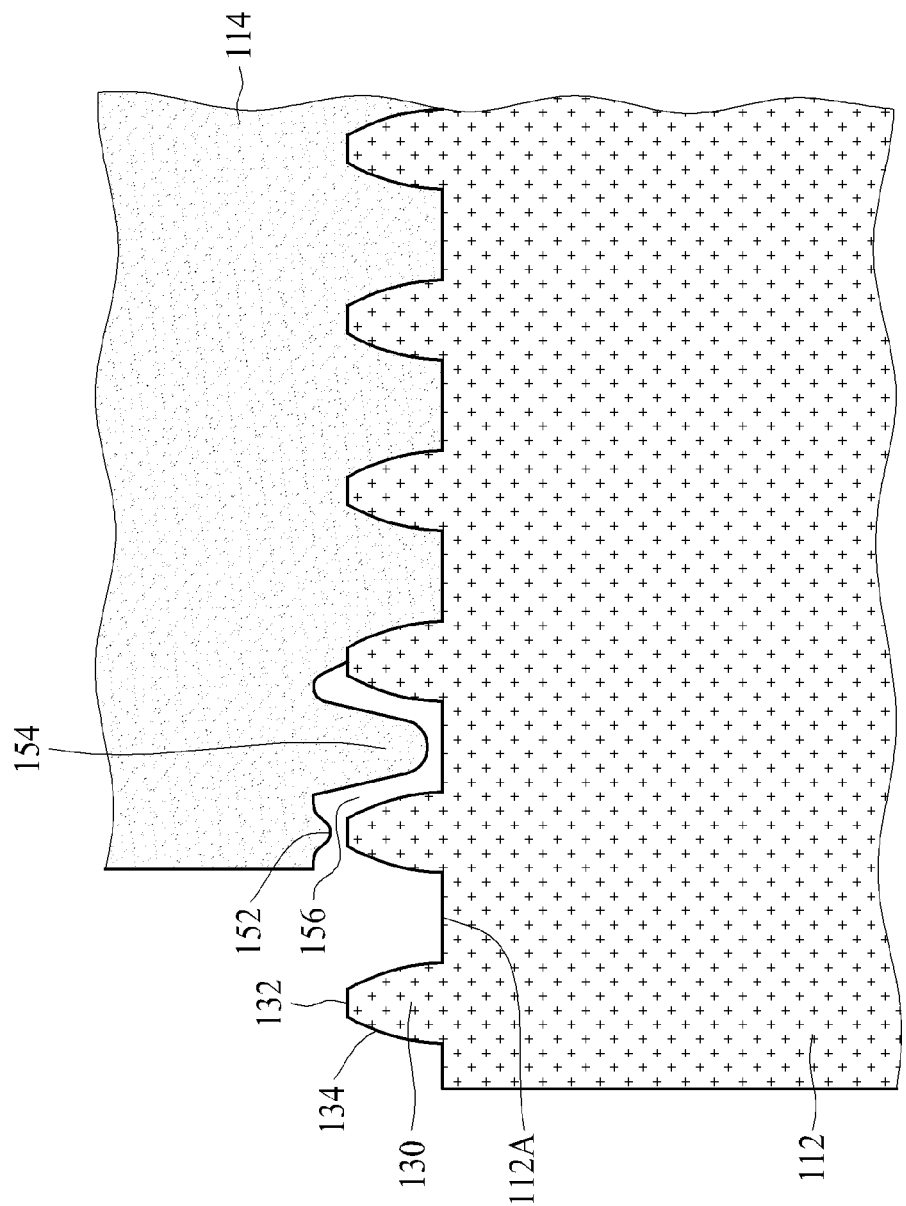
FIG. 21 is a close-up cross-sectional view along the line 5-5 in FIG. 17 according to one embodiment of the present disclosure.
Figure 22:
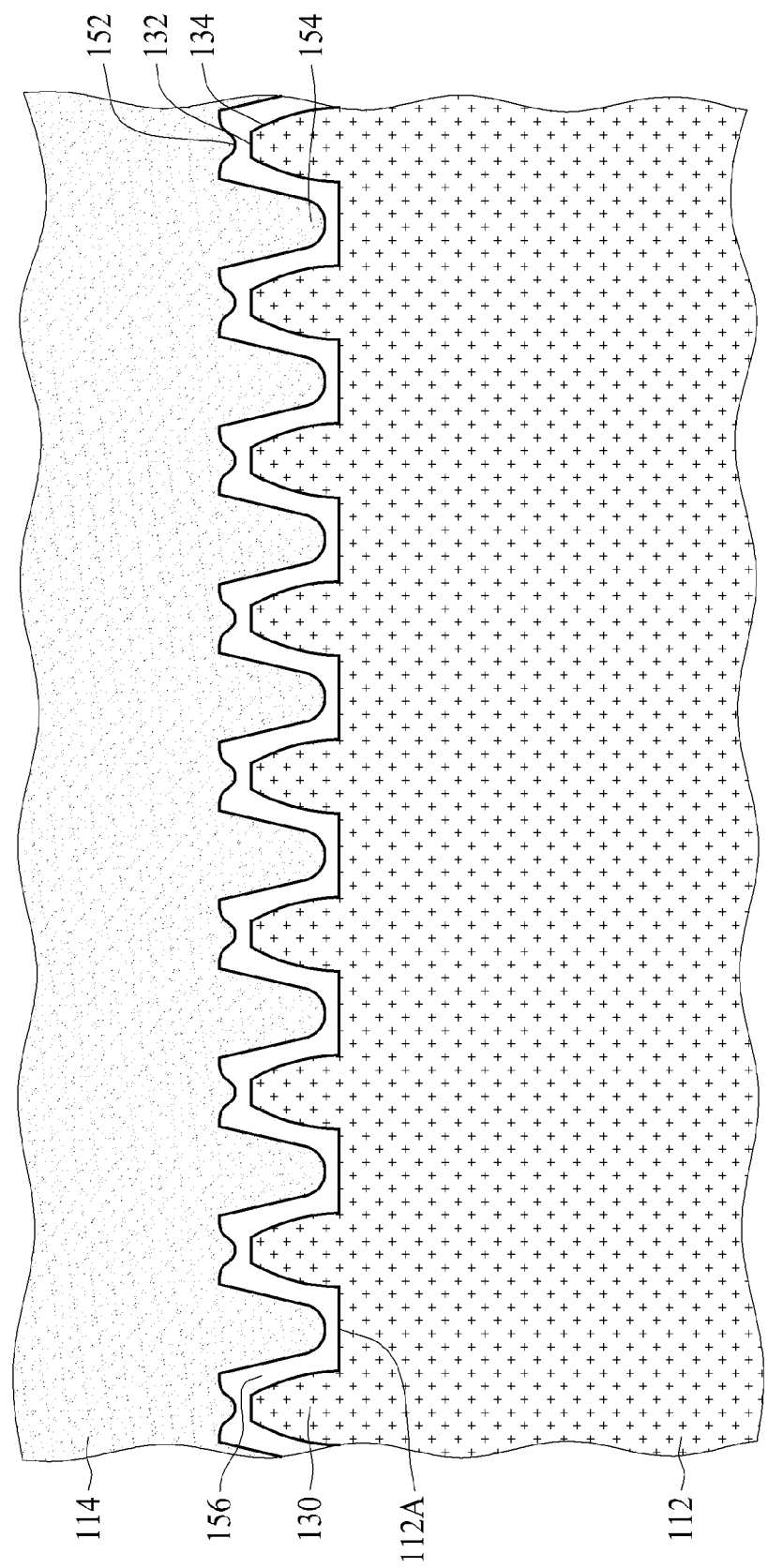
FIG. 22 is a close-up cross-sectional view along the line 6-6 in FIG. 17 according to one embodiment of the present disclosure.

FIG. 21 is a close-up cross-sectional view along the cross-sectional line 5-5 in FIG. 17, and FIG. 21 is a close-up cross-sectional view along the cross-sectional line 6-6 in FIG. 17. In one embodiment of the present disclosure, the first conductive type semiconductor layer 114 includes a plurality of protrusions 154 each facing a portion of the upper surface 112A of the substrate 112 between the bumps 130. Furthermore, the first conductive type semiconductor layer 114 may optionally include a plurality of projections 152 each facing the top plane 132 of the bumps 130. In one embodiment of the present disclosure, the protrusions 154 are positioned in a ring manner at a peripheral region 150 of the first conductive type semiconductor layer 114, and the width of the peripheral region 150 is between 5 and 10 microns, as shown in FIG. 17.

In one embodiment of the present disclosure, the protrusions 154 are spaced apart from the bumps 130 and the portion of the substrate 112 between the bumps 130 by a gap such as an air gap 156. Furthermore, the projections 152 are spaced apart from the top plane 132 of the bumps 130 by the air gap 156. The projections 152, the protrusions 154, the air gap 156, the top plane 132, the wall surfaces 134, the inclined surfaces 136, and the ridge portion 140 are configured to scatter and/or diffract the light beams generated by the light-emitting structure 116 to the outside of the light-emitting device 110. Consequently, the internal total reflection of the light beams in the light-emitting device 110 can be dramatically decreased to prevent the light beams from being adsorbed by the light-emitting structure 116, so as to improve the light extraction efficiency.

Figure 23:
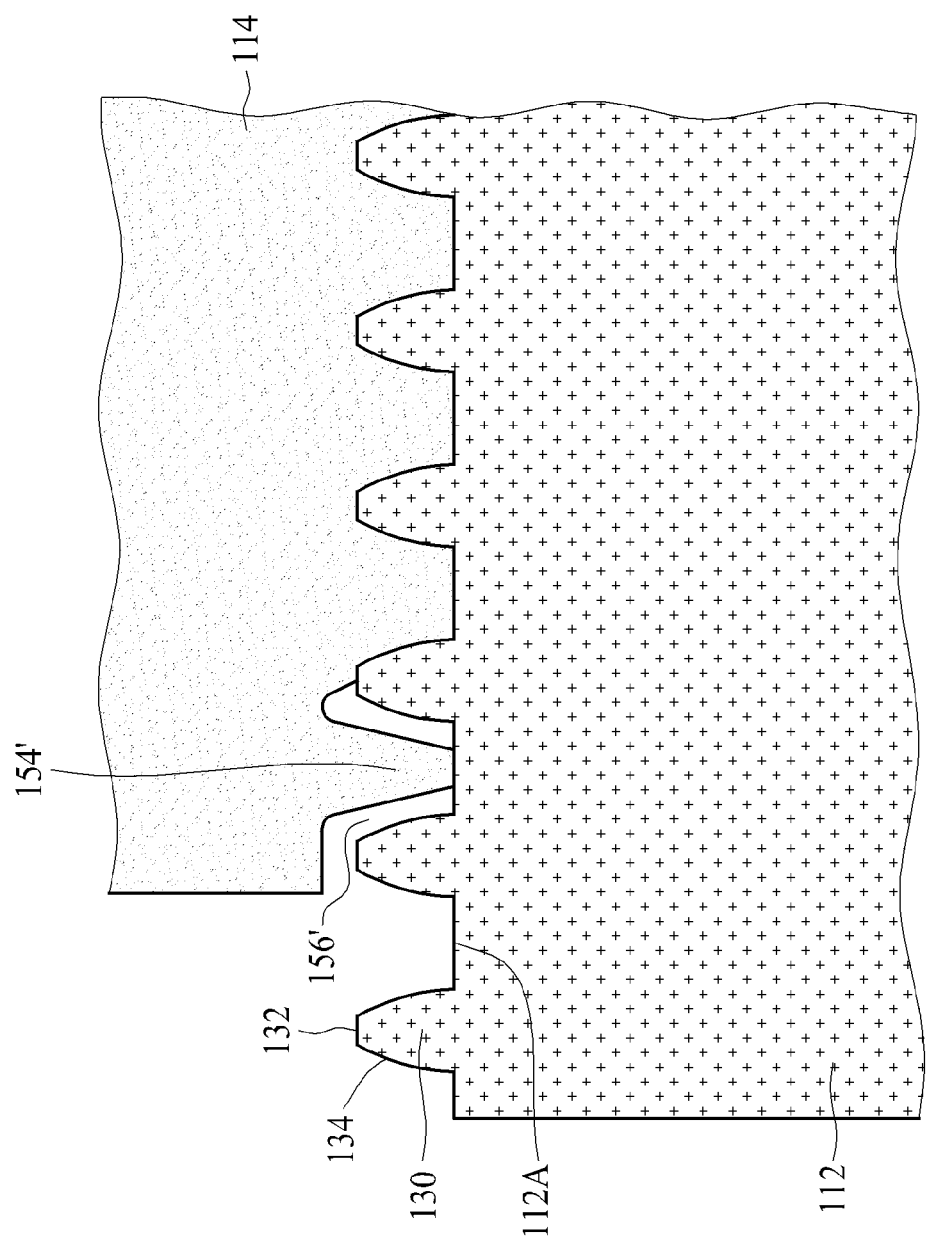
FIG. 23 is a close-up cross-sectional view along the line 5-5 in FIG. 17 according to another embodiment of the present disclosure.
Figure 24:
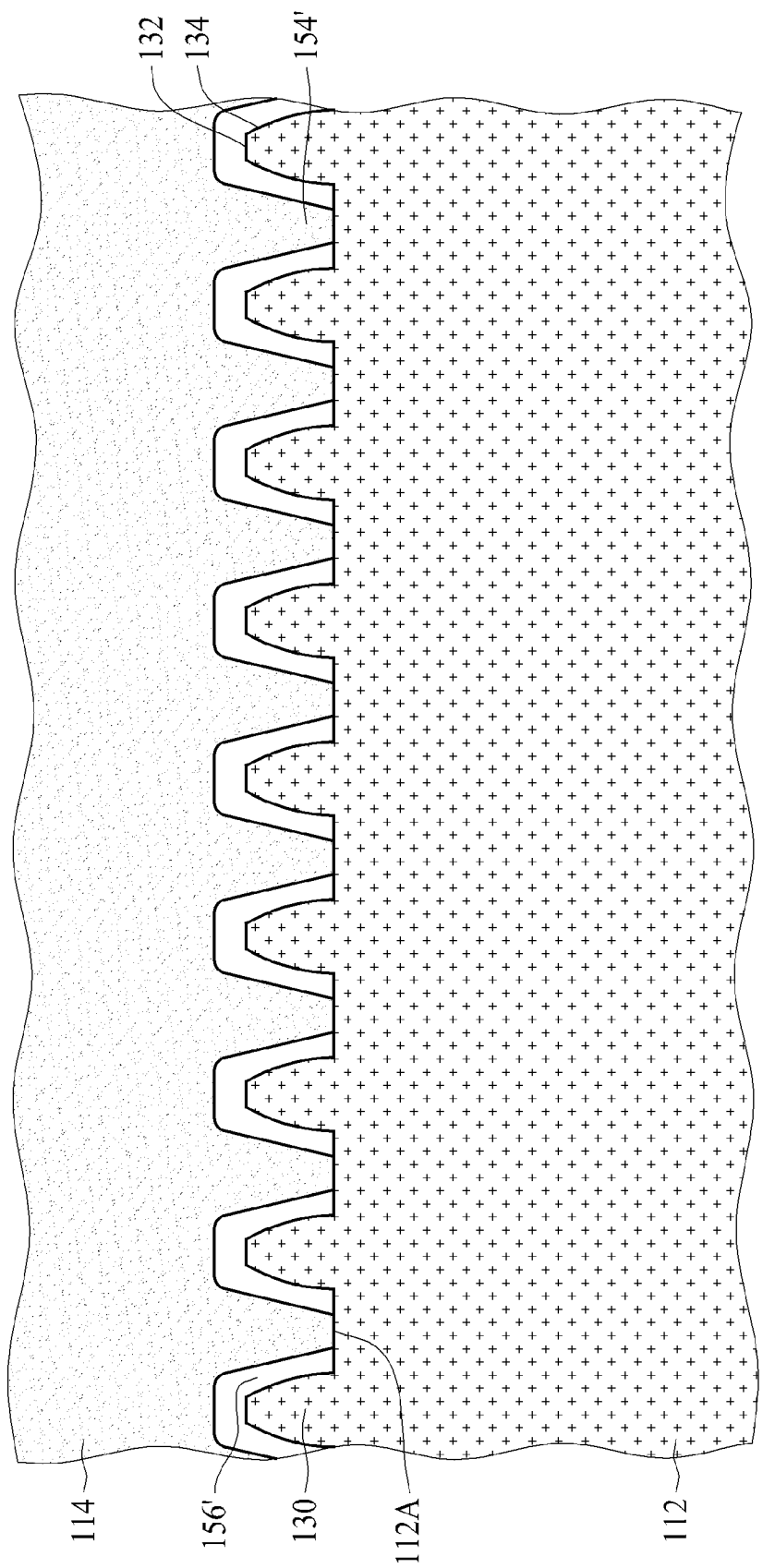
FIG. 24 is a close-up cross-sectional view along the line 6-6 in FIG. 17 according to another embodiment of the present disclosure.

FIG. 23 is a close-up cross-sectional view along the cross-sectional line 5-5 in FIG. 17, and FIG. 24 is a close-up cross-sectional view along the cross-sectional line 6-6 in FIG. 17 according to another embodiment of the present disclosure. In one embodiment of the present disclosure, the first conductive type semiconductor layer 114 includes a plurality of protrusions 154' each facing a portion of the upper surface 112A of the substrate 112 between the bumps 130, the protrusions 154' are positioned in a ring manner at a peripheral region 150 of the first conductive type semiconductor layer 114, and the width of the peripheral region 150 is between 5 and 10 microns, as shown in FIG. 17. Furthermore, the first conductive type semiconductor layer 114 may optionally include a plurality of projections (not shown in FIG. 23 or FIG. 24) each facing the top plane 132 of the bumps 130, similar to the projections 152 shown in FIG. 21.

In one embodiment of the present disclosure, the protrusions 154' contact the portion of the substrate 112 between the bumps 130, and are spaced apart from the bumps 130 by a gap such as an air gap 156'. Furthermore, the protrusions 154', the air gap 156', the top plane 132, the wall surfaces 134, the inclined surfaces 136, and the ridge portion 140 are configured to scatter and/or diffract the light beams generated by the light-emitting structure 116 to the outside of the semiconductor light-emitting device 110. Consequently, the internal total reflection of the light beams in the light-emitting device 110 can be dramatically decreased to prevent the light beams from being adsorbed by the light-emitting structure 116, so as to improve the light extraction efficiency.

The air gap 156 or 156' can be formed by performing a wet etching process after the epitaxy process of the first conductive type semiconductor layer 114. The etchant of the wet etching process may include hydrofluoric acid, nitric acid, phosphoric acid, base solution, or mixture of base solution and alcohol, which etches the first conductive type semiconductor layer 114 along the interface between the bumps 130 of the substrate 112 and the first conductive type semiconductor layer 114. The projections 152 may be removed by the wet etching process such that the first conductive type semiconductor layer 114 only has the protrusion 154 or 154' facing the substrate 112.

In one embodiment of the present disclosure, the substrate 112 includes transparent insulation material such as sapphire, silicon, or silicon carbide; the n-type semiconductor layer 114, the light-emitting structure 116 and the p-type semiconductor layer 118 may include III-V material selected from the group consisting of AlGaN, GaN, InGaN, AlGaInN, GaP, or GaAsP; the contact layer 120 includes III-V material selected from the group consisting of AlGaN, GaN, InGaN, AlGaInN, GaP, or GaAsP; the transparent conductive layer 122 includes indium oxide, tin oxide or indium tin oxide; and the light-emitting structure 116 may includes the quantum well or multi-quantum well structure sandwiched between a p-cladding layer and an n-cladding layer over the n-type semiconductor layer 114. In addition, the n-type semiconductor layer 114, the light-emitting structure 116 and the p-type semiconductor layer 118 may include II-VI material selected from the group consisting of ZnCdSe, ZnMgSe, ZnBaSe, ZnBeSe, ZnCaSe, ZnSrSe, ZnCdSSe, ZnMgSSe, ZnCdTe, ZnMgTe, ZnBaTe, ZnBeTe, ZnCaTe, ZnSrTe, ZnCdSTe and ZnMgSTe. In particular, the epitaxy machine can fabricate these layers over the substrate 112.

In one embodiment of the present disclosure, the top plane 132 is a C-plane (0,0,1) substantially parallel to the upper surface 112A of the substrate 112. The preparation of the bumps 130 may include the steps of forming a mask having a plurality of patterns covering a portion of the substrate, performing an etching process to remove a portion of the substrate not covered by the mask, removing the mask, and performing another etching process over the substrate without the shadowing of the mask to form the bumps 130 over the substrate 112. In one embodiment of the present disclosure, the etching process can be wet etching process using an etchant including phosphoric acid.

Although the present disclosure and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor light-emitting device, comprising:
a substrate including an upper surface and a plurality of bumps positioned over the upper surface in a periodic manner;
a first conductive type semiconductor layer positioned over the substrate, the first conductive type semiconductor layer including a plurality of protrusions each facing a portion of the substrate between the bumps;
a light-emitting structure positioned over the first conductive type semiconductor layer;
a second conductive type semiconductor layer positioned over the light-emitting structure; and
wherein the protrusions are positioned in a ring manner at a peripheral region of the first conductive type semiconductor layer, and wherein the upper surface of the substrate is continuously spaced apart from the first conductive layer inbetween the bumps in the peripheral region by an air gap.

2. The semiconductor light-emitting device of claim 1, wherein the protrusions contact the portion of the substrate between the bumps.

3. The semiconductor light-emitting device of claim 1, wherein the protrusions are spaced apart from the portion of the substrate between the bumps by the air gap.

4. The semiconductor light-emitting device of claim 1, wherein the first conductive type semiconductor layer further includes a plurality of projections each facing a top plane of the bumps.

5. The semiconductor light-emitting device of claim 4, wherein the projections are spaced apart from the top plane of the bumps by the air gap.

6. The semiconductor light-emitting device of claim 1, wherein the substrate is made of a material selected from a group consisting of sapphire, silicon, and silicon carbide.

7. The semiconductor light-emitting device of claim 1, wherein the bumps are arranged in a plurality of odd rows and a plurality of even rows, and each of the bumps in the even rows is corresponding to an interval between adjacent two bumps in the odd rows.

8. The semiconductor light-emitting device of claim 1, wherein the height of the bumps is between 0.5 and 5 microns.

9. The semiconductor light-emitting device of claim 1, wherein the interval between the adjacent two bumps is between 0.5 and 10 microns.

10. The semiconductor light-emitting device of claim 1, wherein the width of the bumps is between 0.5 and 5 microns.

11. The semiconductor light-emitting device of claim 1, wherein the width of the peripheral region is between 5 and 10 microns.

12. The semiconductor light-emitting device of claim 1, wherein each of the bumps includes a top plane, a plurality of wall surfaces and a plurality of inclined surfaces sandwiched between the top plane and the wall surfaces, and each of the inclined surface is between two of the wall surfaces.

13. The semiconductor light-emitting device of claim 12, wherein the top plane is a C-plane.

14. The semiconductor light-emitting device of claim 12, wherein the inclined surface and the wall surface have different inclined angles.

15. The semiconductor light-emitting device of claim 12, wherein the inclined surface connects to the wall surface, and the included angle between the inclined surface and the wall surface is between 90 and 180 degrees.

16. The semiconductor light-emitting device of claim 12, wherein the wall surface is arc-shaped.

17. The semiconductor light-emitting device of claim 12, wherein the bump includes a bottom plane having three corners.

18. The semiconductor light-emitting device of claim 17, wherein the connection of the corners is arc-shaped.

19. The semiconductor light-emitting device of claim 1, wherein the first conductive type semiconductor layer further includes a plurality of second protrusions distant from the peripheral region, and one of the protrusions has a width smaller than a width of one of the second protrusions.

* * * * *